United States Patent
Tokai et al.

(10) Patent No.: US 6,566,199 B2
(45) Date of Patent: May 20, 2003

(54) METHOD AND SYSTEM FOR FORMING FILM, SEMICONDUCTOR DEVICE AND FABRICATION METHOD THEREOF

(75) Inventors: Nobuo Tokai, Narita (JP); Yuji Maeda, Narita (JP); Masayuki Hashimoto, Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/761,637

(22) Filed: Jan. 18, 2001

(65) Prior Publication Data

US 2002/0014700 A1 Feb. 7, 2002

(30) Foreign Application Priority Data

Jan. 18, 2000 (JP) .......................... 2000-009298
May 15, 2000 (JP) .......................... 2000-142137

(51) Int. Cl.$^7$ ........................................... H01L 21/336
(52) U.S. Cl. ..................... 438/261; 438/770; 438/773; 438/787
(58) Field of Search ................... 438/201, 211, 438/216, 257, 261, 287, 761–763, 765, 770, 773, 787

(56) References Cited

U.S. PATENT DOCUMENTS

| | | |
|---|---|---|
| 4,139,658 A | 2/1979 | Cohen et al. |
| 4,214,919 A | 7/1980 | Young |
| 4,268,538 A | 5/1981 | Toole et al. |
| 4,505,028 A | 3/1985 | Kobayashi et al. |
| 4,818,327 A | 4/1989 | Davis et al. |
| 4,906,595 A | 3/1990 | Van der Plas et al. |
| 5,242,468 A | 9/1993 | Clark et al. |
| 5,294,571 A | 3/1994 | Fujishiro et al. |
| 5,618,349 A | 4/1997 | Yuuki |
| 5,631,199 A | 5/1997 | Park |
| 5,633,212 A | 5/1997 | Yuuki |
| 5,693,578 A | 12/1997 | Nakanishi et al. |
| 5,777,300 A | 7/1998 | Homma et al. |
| 5,851,892 A | 12/1998 | Lojek et al. |
| RE36,290 E | 9/1999 | Clark et al. |
| 6,037,273 A | 3/2000 | Gronet et al. |
| 6,114,258 A * | 9/2000 | Miner et al. ................. 438/216 |
| 6,159,866 A | 12/2000 | Gronet et al. |
| 6,177,316 B1 * | 1/2001 | He et al. ..................... 438/258 |

OTHER PUBLICATIONS

"General Relationship for the Thermal Oxidation of Silicon", by Deal et al., Journal of Applied Physics, vol. 36, No. 12 (Dec. 1965), pp. 3770–3778.

(List continued on next page.)

Primary Examiner—Amir Zarabian
Assistant Examiner—Jamie L. Brophy
(74) Attorney, Agent, or Firm—Blakely Sokoloff Taylor & Zafman

(57) ABSTRACT

An object of the present invention is to provide a film-forming method, a film-forming system, etc. capable of achieving adequate thickness repeatability and uniformity and sufficiently large film-forming rates in film formation of a thin film on a substrate to be treated and also capable of simplifying a system configuration. A thermal treatment system 1 according to the present invention is a system for forming a thin film of $SiO_2$ on an Si wafer W and is provided with a reactant gas exhaust system 15 for reducing the pressure around the Si wafer W, a reactant gas supply system 14 for supplying hydrogen gas Gh and oxygen gas Go so as to mix them, onto the Si wafer W, and a chamber 2 having a lamp group 9G for heating the Si wafer W, and a wafer support member 3. The Si wafer W is set in the chamber 2, the interior of the chamber 2 is depressurized, the Si wafer W is mounted on the wafer support member 3, the reactant gases X as a mixture of hydrogen gas Gh and oxygen gas Go are supplied into a space Sb in the chamber 2 to flow, and the Si wafer W is heated by the lamp group 9G.

9 Claims, 13 Drawing Sheets

OTHER PUBLICATIONS

"Thermal Oxidation of Silicon in Various Oxygen Partial Pressures Diluted by Nitrogen", by Kamigaki et al., Journal of Applied Physics, vol. 48, No. 7 (Jul. 1977), pp. 2891–2896.

Ayuka Morioka et al., "*Highly efficient generation of atomic oxygen and its application to low temperature oxidation of Si (100) substrates*", Faculty of Technology, Tokyo University of Agriculture and Technology, pp. 189–192.

O.D. Trapp, Ph.D et al., Semiconductor Technology Handbook, Technology Associates, Apr. 15, 1980, p. 3–10.

PCT Search Report PCT/US98/11577.

A.N. Chandorkar et al. "Dependence of Partial Pressure of H2) on Pyrogenic Growth of Silicon Dioxide", Department of Electrical Engineering, pp. 415–417.

J. A. Aboaf "Formation of 20–25Å Thermal Oxide Film on Silicon at 950° C.–1140° C.", Technical Note, 1046 Journal of the Electrochemical Society, vol. 118, No. 8.

Yen–Chuan Tseng et al. "A New Method for Obtaining a Clean SiO2–Si Interface Using NH3–O2 Oxidation", Japanese Journal of Applied Physics, vol. 28, No. 2, Feb. 1989, pp. L329–L331.

Bruce E. Deal "Thermal Oxidation Kinetics of Silicon in Pyrogenic H2O and 5% HCl/H2O Mixtures", Journal of Electrochemical Society: Solid State Science and Technology,vol. 125, No. 4, Apr. 1978, pp. 576–579.

Tatsuya Enomoto et al. "Thermal Oxidation Rate of a Si3N4 Film and Its Masking Effect Against Oxidation of Silicon", Japanese Journal of Applied Materials, vol. 17, No. 6, Jun. 1978, pp. 1049–1058.

Naturo Tsubouchi et al. "Oxidation of Silicon in High–Pressure Steam" Japanese Journal of Applied Physics, vol. 16, 1997, pp. 855–856.

Kazuyuki Ohmi et al. "Formation Process of Highly Reliable Ultra–Thin Gate Oxide" Japanese Journal of Applied Physics, vol. 35, 1996, Part 1, No. 2B, pp. 1531–1534.

Koji Makihara et al. "Preoxide–Controlled Oxidation for Very Thin Oxide Films", Laboratory for Microelectronics, Research Institute of Electrical Communication, Tohoku University.

T. Ohmi et al. "Very Thin Oxide Film On a Silicon Surface by Ultraclean Oxidation" Applied Physics, American Institute of Physics, pp. 2126–2128.

Stanley Wolf et al. "Silicon Processing for the VLSI Era" vol. 1 Processing Technology, Lattice Press, pp. 209–217.

* cited by examiner

PARTIAL PRESSURE OF REACTANT GAS

TOTAL PRESSURE IN CHAMBER
(TOTAL PRESSURE OF REACTANT GASES)

METHOD AND SYSTEM FOR FORMING FILM, SEMICONDUCTOR DEVICE AND FABRICATION METHOD THEREOF

BACKGROUND OF THE INVENTION

1. Field of the Invention

The present invention relates to a method for forming a film, a system for forming a film, a semiconductor device, and a fabrication method thereof.

2. Related Background Art

Thermal treatment systems being one of semiconductor equipment have been used heretofore as systems for forming a thin film of oxide on a substrate to be treated, such as a semiconductor substrate or the like. Such thermal treatment systems include, for example, systems for oxidizing the surface of the substrate by heating the substrate while supplying oxygen dried under almost ordinary pressure, to the substrate of semiconductor wafer supported on a substrate support member in a chamber (dry oxidation such as RTO; Rapid Thermal Oxidation, or the like), or systems for oxidizing the surface of the substrate by heating the substrate in an oxidizing atmosphere containing water generated by preliminary combustion of oxygen and hydrogen (wet oxidation by external combustion method). There are also attempts to employ a method of oxidizing the surface by exposing the substrate to radical oxygen (or oxygen radicals) generated by ultraviolet irradiation or the like.

SUMMARY OF THE INVENTION

Incidentally, with increase in integration density of such semiconductor devices as VLSI devices, there is the recently increasing desire of further thinning the film while maintaining reliability, for the devices with a thin film of gate oxide or the like. In fabrication of such semiconductor devices, there is always the earnest desire for further enhancement of productivity.

Against such needs, the film formation by conventional dry oxidation such as RTO was superior in repeatability and uniformity of thickness of the film formed, but there was such a tendency that film-forming rates (deposition rates) were not always adequately large. On the other hand, the film formation by wet oxidation in the external combustion method failed to provide adequate controllability of film-forming reaction because of the use of external combustion and thus involved the risk of degrading the repeatability and uniformity of thickness. In addition, it required a torch unit for externally burning oxygen and hydrogen. Meanwhile, the film formation by radical oxygen had the problem that it was necessary to use a unit such as an ultraviolet irradiating unit, a plasma generator, or an ozonator for generating radicals and the system became complicated.

Therefore, the present invention has been accomplished under such circumstances and an object of the invention is to provide a film-forming method and a film-forming system capable of achieving satisfactory repeatability and uniformity of thickness and adequately large deposition rates in the film formation of a thin film on the substrate and simplifying the system configuration.

In order to solve the above problems, the inventors have been conducted intensive and extensive research and found a film-forming pattern demonstrating different behavior from the conventional dry oxidation or wet oxidation on the occasion of forming an oxide film on a silicon (Si) substrate. The inventors continued the research about the reaction mechanism of oxidation in this film formation, discovered that chemically active oxidizing factors (chemically active species) were involved in the reaction, and found preferred film-forming conditions, thus completing the present invention.

Specifically, a film-forming method according to the present invention is a method for forming a thin film on a substrate to be treated, which comprises a pressure reducing step of reducing pressure around the substrate, a heating step of heating the substrate, and a reactant gas supply step of supplying a first gas and a second gas, said second gas being capable of releasing energy by reaction with the first gas, so as to mix the first gas and the second gas, onto the substrate. These pressure reducing step, heating step, and reactant gas supply step do not have to be simultaneously started and stopped, but it is desirable to first carry out the pressure reducing step to reduce the pressure around the substrate and thereafter continuously perform the reactant gas supply step of supplying the gases onto the substrate to maintain the pressure of the reactant gases at a predetermined pressure, while heating the substrate.

In this film-forming method, the first and second gases supplied so as to mix onto the substrate can react with each other above the vicinity of the substrate by the heating of the substrate. This results in generating a variety of chemically active reaction species (chemically active species) immediately above the substrate, so that the surface of the substrate is exposed to these chemically active species. The chemically active species are considered to reach the interface (outermost surface) of the substrate and exert their energy on the constituents of the interface to promote reactions such as decomposition, dissociation, and the like of the constituents and reactions thereof with the chemically active species themselves.

Such reactions gradually proceed from the interface to the interior of the substrate, whereby a thin film of reaction products is formed in a predetermined thickness on the surface of the substrate. It was then verified that the reactivity of the film formation was able to be enhanced by carrying out this film-forming method under a reduced pressure condition.

The film-forming method is preferably one further comprising a substrate setting step of bringing the substrate into a chamber having a support section on which the substrate is set to be supported and a heating section opposed to the substrate and functioning to heat the substrate, and setting the substrate on the support section, wherein the pressure reducing step comprises a step of reducing the pressure around the substrate by reducing pressure in the chamber housing the substrate, wherein the heating step comprises a step of heating the substrate supported on the support section, by the heating section, and wherein the reactant gas supply step comprises a step of supplying the first gas and the second gas so as to mix the first and second gases, to between the heating section and the substrate supported on the support section. This makes it easier to maintain the reduced pressure state around the substrate, i.e., to maintain the first and second gases in predetermined concentrations. Since the first gas and the second gas exist between the substrate and the heating section, reaction efficiency between them is increased.

Further, it is desirable that in the pressure reducing step and the reactant gas supply step, the pressure around the substrate or the pressure in the chamber is regulated to 0.5 to 2 kPa (about 4 to 15 Torr). When the pressure inside the chamber is controlled in this range, the film-forming rate becomes satisfactorily high and an extremely thin film can be formed with excellent uniformity and repeatability of thickness.

Yet further, it is also useful that the reactant gas supply step comprises a step of varying a mixture ratio of the first gas and the second gas or a step of varying a feed of at least either one of the first gas and the second gas. Execution of the former step will result in varying concentrations and the composition of the chemically active species evolved from the reaction between the two gases, while the latter step is suitable for pressure control (concentration control) at a constant mixture ratio of the two gases and can substantially also serve as the former step.

Yet further, the reactant gas supply step is preferably a step using a gas having hydrogen atoms in molecules, as the first gas and using an oxygen gas as the second gas. In this case, the first gas is oxidized to bring about so-called combustion reaction and there is a tendency to facilitate attainment of high reaction energy. As a result, it is feasible to increase the concentrations and energy of the chemically active species evolved from the reaction between the two gases.

Specifically, the first gas is more preferably hydrogen gas. In this film-forming method, the mixture of hydrogen gas and oxygen gas burns (reacts) immediately near the heated substrate, for example, immediately above the substrate to evolve water (water vapor) through various elementary reactions, whereby the substrate is oxidized to form an oxide film. In this case, different from the conventional method for introducing the water (steam) generated by the external combustion, onto the substrate, the various chemically active species increase the percentage of their contribution on the oxidation reaction of the substrate.

Then reaction heat generated in the reaction between hydrogen gas and oxygen gas is imparted to chemical change such as dissociation or the like of the substances constituting the substrate, whereby the activation energy of the oxidation reaction of the substrate appears drastically reduced. For these reasons, the film-forming rates become extremely high. For example, it was verified with an Si wafer as the substrate that the film-forming rates of $SiO_2$ film were drastically increased and sufficiently uniform thin films were able to be formed with satisfactory repeatability, as compared with the conventional dry oxidation processes.

More specifically, it is more preferable to use a substrate with a nitride film, as the substrate and form an oxide film as a thin film by oxidizing at least a part of the nitride film. For example, for using an Si wafer with a film of silicon nitride or the like as the substrate and oxidizing the silicon nitride film, the conventional wet oxidation by the external combustion method had the following problems;

1) the film-forming temperature had to be increased in order to raise the film-forming rates to a satisfactory level and, where there was restraint on the film-forming temperature, the film formation had to be carried out over a long period of time;

2) the quantity of input heat into the Si wafer became large, so that there was the possibility of causing change of shape such as warpage or the like of the Si wafer.

For forming a multilayered film, for example, of ONO (oxide-nitride-oxide) structure by the CVD (Chemical Vapor Deposition) method, particularly, by the high temperature CVD (HTO) method or the like, the layers were sequentially deposited. This means that three layer deposition steps had to be carried out in this case. At this time, the whole thin film consisting of the three layers must include dispersion of thickness of each layer. This dispersion of thickness raises the possibility of failing to adapt adequately for the film thinning demanded from the increase in the integration density of devices and there was thus the desire for further uniformity of thickness, particularly, for the Si wafers moving toward larger diameters.

In contrast with this conventional method, the present invention is such that, for example, for forming an oxide film on a nitride film formed by HTO, the nitride film itself is oxidized. Namely, the oxide film is not deposited on the nitride film. For forming the above ONO structure, an oxide film is further deposited by the conventional HTO method. Therefore, the thin film consisting of the three layers can be formed by carrying out only two deposition steps, so that the whole film includes only dispersion of thickness of the two layers made by the HTO method. thus the thickness uniformity of the thin film can be enhanced as compared with the conventional method. In addition, oxidation rates of the nitride film (film-forming rates of silicon oxide film) are drastically increased and the oxide film can be well formed by the treatment at lower temperature and in shorter time than by the conventional wet oxidation.

A fabrication method of a semiconductor device according to the present invention is a method for fabricating a semiconductor device comprising an interelectrode insulating film interposed between electrodes and having a nitride film and an oxide film, wherein at least a part of the oxide film in the interelectrode insulating film is formed by the film-forming method of the present invention. According to this fabrication method, at least a part of the nitride film on the substrate for construction of the semiconductor device is oxidized by the film-forming method of the present invention. This allows a thin oxide film to be formed with excellent uniformity of thickness and in desired thickness. As a result, the thin interlayer insulating film can be formed with excellent dielectric strength characteristic and in desired thickness.

Further, use of the aforementioned wet oxidation method and HTO method requires a thermal treatment at high temperature and over a long period, because oxidation rates are low. As a consequence, it may cause structural change of the electrodes previously formed, and this can negatively affect the device characteristics of the semiconductor device. In contrast with it, the fabrication method of the semiconductor device according to the present invention can fully suppress such negative effect, because the oxide film is formed by the thermal treatment at relatively low temperature and in relatively short time.

Further, the semiconductor device is preferably a nonvolatile memory comprising a stack of a floating gate electrode, a control gate electrode, and an interelectrode insulating film interposed between the floating gate electrode and the control gate electrode and having a nitride film and an oxide film; specifically, the fabrication method of the semiconductor device according to the present invention is preferably applied to fabrication of EEPROM (Electrically Erasable Programmable Read Only Memory). If a thermal treatment at high temperature and over long time were carried out during formation of the oxide film in the interelectrode insulating film of the nonvolatile (semiconductor) memory, it could deteriorate, for example, the tunnel oxide film on which the floating gate electrode of polysilicon structure is laid. This might result in degrading rewriting reliability being one important property of the nonvolatile memory.

Particularly, for the EEPROM (flash memory) with the electrically rewritable function, this degradation of rewriting reliability is a significant issue. In contrast with it, the fabrication method of the semiconductor device according to the present invention permits the oxide film to be fabricated by the thermal treatment at relatively low temperature and in relatively short time, and thus it can adequately suppress the degradation of the rewriting reliability of the nonvolatile memory.

A film-forming apparatus (system) according to the present invention is an apparatus (a system) for suitably carrying out the film-forming method of the present invention, which is a system for forming a thin film on a substrate to be treated. The film-forming system comprises a pressure reducing section for reducing pressure around the substrate, a heating section for heating the substrate, and a reactant gas supply section for supplying a first gas and a second gas, said second gas being capable of releasing energy by reaction with the first gas, so as to mix the first gas and the second gas, onto the substrate.

Further, the film-forming system is preferably one further comprising a chamber, said chamber having a support section on which the substrate is mounted to be supported, and the heating section opposed to the substrate, wherein the pressure reducing section is a section for reducing pressure inside the chamber and wherein the reactant gas supply section is a section for supplying the first gas and the second gas so as to mix the first gas and the second gas, to between the heating section and the substrate supported on the support section.

Yet further, the pressure reducing section is preferably a section capable of regulating the pressure around the substrate or the pressure inside the chamber to 0.5 to 2 kPa (about 4 to 15 Torr). Moreover, the reactant gas supply section preferably comprises a first flow control for controlling a feed of the first gas and a second flow control for controlling a feed of the second gas. In addition, the reactant gas supply section is more preferably a section for supplying, preferably, a gas having hydrogen atoms in molecules or, particularly preferably, hydrogen gas as the first gas and for supplying oxygen gas as the second gas.

It is more preferable that the substrate is a substrate with a nitride film formed thereon and that the film-forming system be one for forming an oxide film as a thin film by oxidizing at least a part of the nitride film.

A semiconductor device according to the present invention is one effectively fabricated by the fabrication method of the semiconductor device according to the present invention. Namely, the semiconductor device of the present invention is one comprising an interelectrode insulating film interposed between electrodes and having a nitride film and an oxide film, wherein at least a part of the oxide film in the interelectrode insulating film is formed by the film-forming system or the film-forming method according to the present invention.

Here the present invention acts extremely effective when the semiconductor device is a nonvolatile memory comprising a stack of a floating gate electrode, a control gate electrode, and an interelectrode insulating film interposed between the floating gate electrode and the control gate electrode and having a nitride film and an oxide film; particularly, an EEPROM.

DESCRIPTION OF THE PREFERRED EMBODIMENTS

Figure 1:
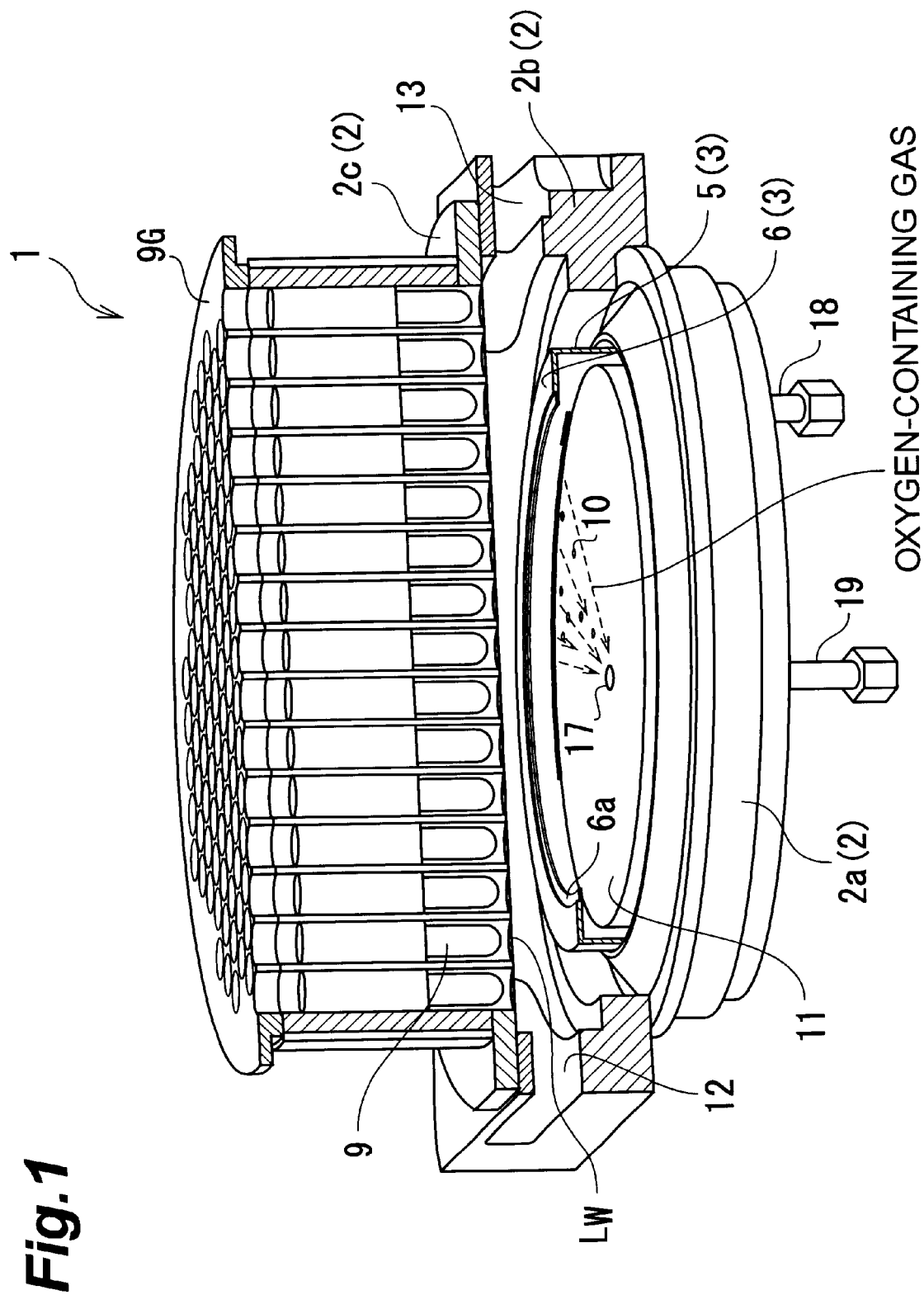
FIG. 1 is a perspective view to show a preferred embodiment of the film-forming system according to the present invention, part of which is illustrated as a cross-sectional view.

Embodiments of the present invention will be described below with reference to the accompanying drawings. The same elements will be denoted by the same reference symbols and redundant description will be omitted. Positional relations including the vertical and horizontal relations will be based on those in the drawings unless otherwise specified.

Figure 2:
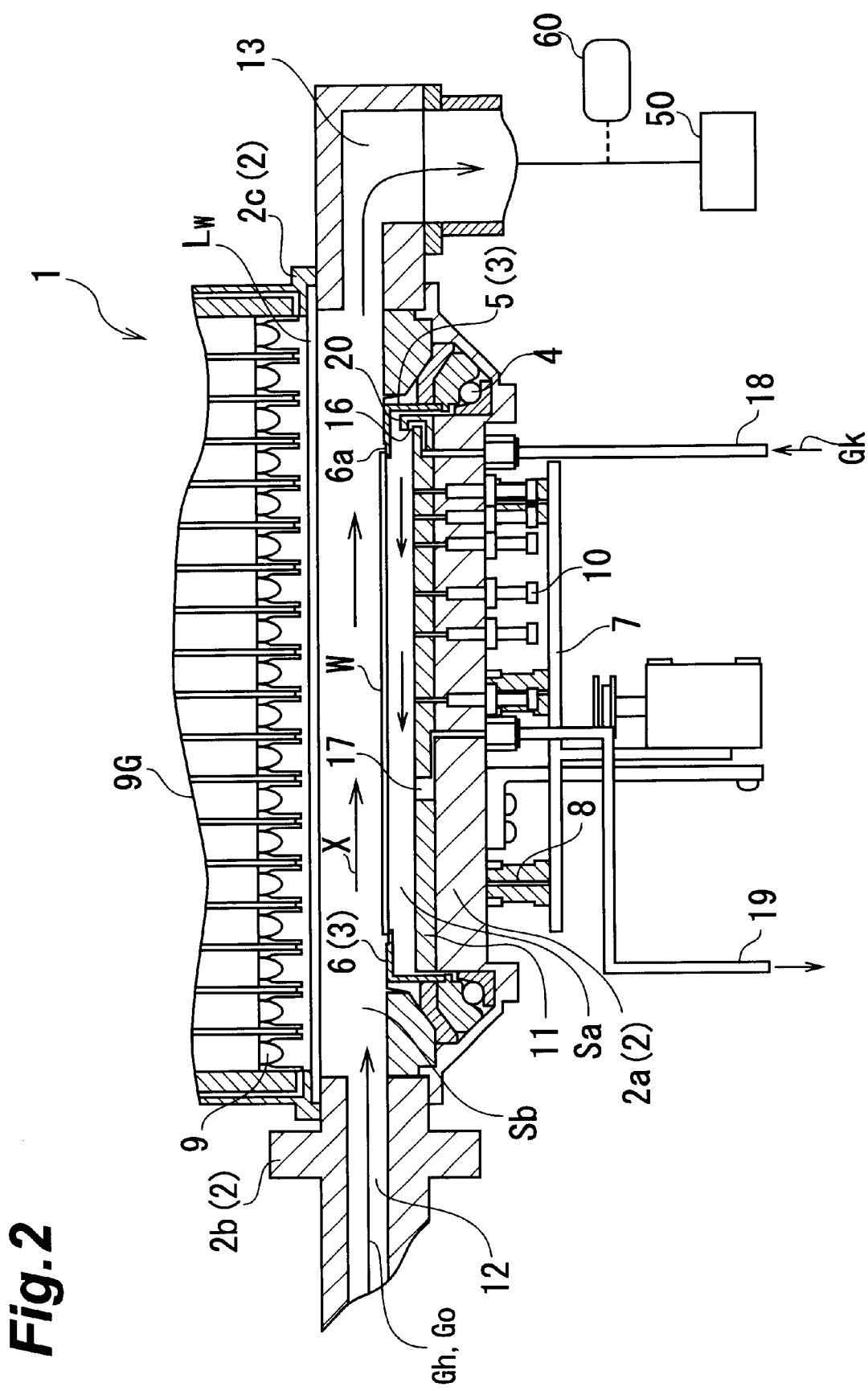
FIG. 2 is a cross-sectional view of a thermal treatment system, enlarged in part, in the preferred embodiment of the film-forming system according to the present invention.

FIG. 1 is a perspective view to show a preferred embodiment of the film-forming system according to the present invention, part of which is illustrated as a cross-sectional view. FIG. 2 is a cross-sectional view of a thermal treatment system, enlarged in part, in the preferred embodiment of the film-forming system according to the present invention. In the figures, the thermal treatment system 1 (film-forming system) is a single wafer quick heating thermal treatment system for carrying out a thermal treatment while controlling the temperature of an Si wafer W as a substrate to be treated, and is provided with a chamber 2 comprised of a base section 2a, a side wall section 2b, and a lid section 2c.

A wafer support member 3 (support section) for supporting the Si wafer W is installed in this chamber 2. The wafer support member 3 is composed of a cylindrical frame 5 rotatably mounted through a bearing 4 on the base section 2a, and a ring frame 6 disposed at the upper end of this cylindrical frame 5. A supporting step member 6a for supporting the edge part of the Si wafer W is provided at the inside edge of the ring frame 6. In a state in which the Si wafer W is supported on the wafer support member 3 (see FIG. 2), a space Sa surrounded by the base section 2a, the wafer support member 3, and the Si wafer W is defined on the back side of the Si wafer W.

Below the base section 2a there is provided a lift member 7 for letting the wafer support member 3 support the Si wafer W carried into the chamber 2 by a carry robot (not illustrated). This lift member 7 has a plurality of (for example, three) support pins 8 penetrating the base section 2a, for lifting the Si wafer W.

Further, above the lid 2c of the chamber 2, a lamp group 9G (heating section) is disposed and is comprised of a plurality of heating lamps 9 (heating section) for heating the Si wafer W supported on the wafer support member 3. The lid 2c is provided with a circular lamp window Lw, so that heat radiation from the heating lamps 9 is transferred through the lamp window Lw onto the Si wafer W. The base section 2a is provided with temperature sensors 10 for optically detecting the temperature of the Si wafer W. A plurality of temperature sensors 10 are assembled in a substantially sectorial sensor setting area including the center of circular plate 11 and part of the periphery thereof and having a predetermined angle (e.g., 90°), in the circular plate 11 surrounded by the wafer support member 3 in the base section 2a. The aforementioned space Sa is optically a perfect closed space and thus the temperature of the Si wafer W can be detected without trouble in the space Sa by the optical temperature sensors 10.

A gas supply port 12 and a gas exhaust port 13 are provided opposite to each other in the side wall 2b of the chamber 2. Connected to the gas supply port 12 is a reactant gas supply system 14 (see FIG. 3 described hereinafter) for supplying hydrogen gas Gh ($H_2$ gas; first gas) and oxygen gas Go ($O_2$ gas; second gas) so as to mix them, into a space Sb on the front surface side of the Si wafer W, which is the outside of the space Sa present on the back surface side of the Si wafer W in the chamber 2. On the other hand, connected through a tube to the gas exhaust port 13 is a pump 50 constituting a reactant gas exhaust system 15 (see FIG. 3 described hereinafter) for discharging the gases in the space Sb to the outside of the chamber 2. This pump 50 functions to depressurize the spaces Sa, Sb in the chamber 2 and a pressure sensor 60 for detecting the pressure in the chamber 2 is attached to the tube connected to the gas exhaust port 13, i.e., to the gas exhaust path.

Further, the circular plate 11 of the base section 2a is provided with a gas supply port 16 and a gas exhaust port 17.

Connected to the gas supply port 16 is a mixed gas supply system 18 for supplying mixed gases Gk, for example, of oxygen gas and nitrogen gas ($N_2$ gas) into the space Sa, and connected to the gas exhaust port 17 is a mixed gas exhaust system 19 for discharging the gas in the space Sa to the outside of the chamber 2.

Further, a projection 20 of an L-shaped cross section is provided in part embracing the sensor setting area in the periphery of the circular plate 11 and the gas supply port 16 is formed inside this projection 20. The gas exhaust port 17 is formed at a position slightly shifted from the center of the circular plate 11 to the opposite side of the gas supply port 16 in the circular plate 11, and the sensor setting area is defined between the gas supply port 16 and the gas exhaust port 17. In this structure, the mixed gases Gk introduced through the gas supply port 16 flow through the entire range of the sensor setting area of the circular plate 11 to be discharged through the gas exhaust port 17.

Figure 3:
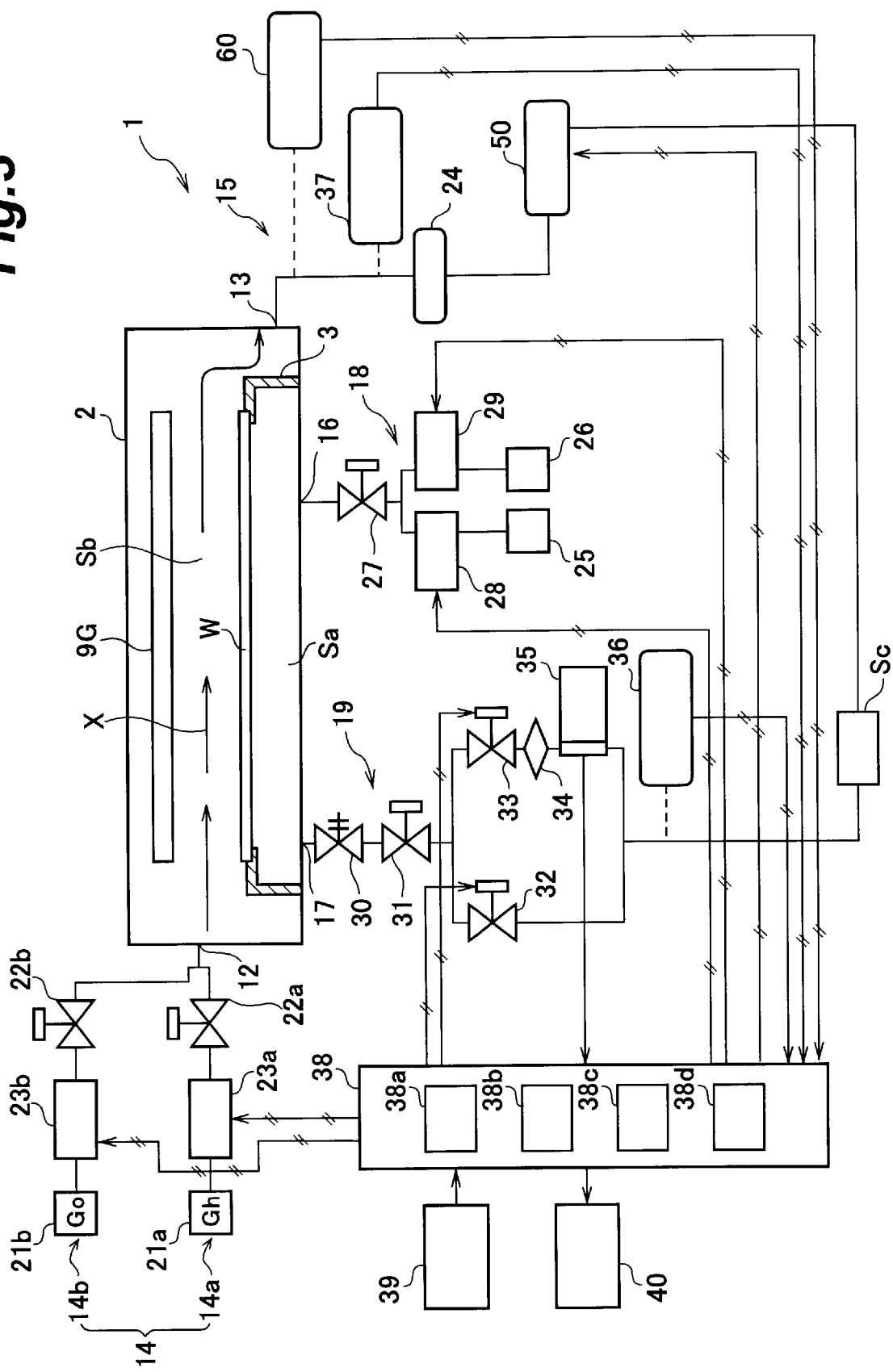
FIG. 3 is a block diagram to show a configuration of a gas supply system in the preferred embodiment of the film-forming system according to the present invention.

FIG. 3 is a block diagram to show the configuration of the gas supply system and others in the thermal treatment system 1 illustrated in FIG. 1. In the same figure, the reactant gas supply system 14 (reactant gas supply section) is equipped with a hydrogen gas supply 14a and an oxygen gas supply 14b. The hydrogen gas supply 14a has a hydrogen gas source 21a, a valve 22a, disposed between the gas supply port 12 of the chamber 2 and the hydrogen gas source 21a, for controlling on/off of flow of hydrogen gas Gh supplied from the hydrogen gas source 21a into the space Sb, and a mass flow controller (hereinafter referred to as "MFC") 23a (first flow control) for controlling the flow rate of hydrogen gas Gh.

The oxygen gas supply 14b has an oxygen gas source 21b, a valve 22b, disposed between the gas supply port 12 of the chamber 2 and the oxygen gas source 21b, for controlling on/off of flow of oxygen gas Go supplied from the oxygen gas source 21b into the space Sb, and an MFC 23b (second flow control) for controlling the flow rate of oxygen gas Go. The hydrogen gas supply 14a and the oxygen gas supply 14b are joined to each other, for example, by a T-shaped tube or a T-shaped valve or the like, between the valves 22a, 22b and the gas supply port 12, whereby the hydrogen gas Gh and oxygen gas Go are mixed in this joint portion immediately before the gas supply port 12, thereby supplying the reactant gases X into the space Sb.

On the other hand, the reactant gas exhaust system 15 (pressure reducing section) has a pressure control valve (hereinafter referred to as "PCV") 24 connected to the gas exhaust port 13 of the chamber 2 and a pump 50 connected to this PCV 24. The pump 50 is connected to a scrubber Sc and the gas discharged from the interior of the space Sb is forced to the scrubber Sc.

The mixed gas supply system 18 consists of an oxygen gas source 25 and a nitrogen gas source 26, a valve 27, disposed between the gas supply port 16 of the chamber 2 and these gas sources 25, 26, for controlling on/off of flow of mixed gases Gk supplied from these gas sources 25, 26 into the space Sa, and MFCs 28, 29 for controlling respective flow rates of oxygen gas and $N_2$ gas supplied into the space Sa.

On the other hand, the mixed gas exhaust system 19 consists of a valve 30 such as a needle valve or the like, connected to the gas exhaust port 17 of the chamber 2, for controlling the flow rate of the gas discharged from the interior of the space Sa to the outside of the chamber 2, a main valve 31, connected to the outlet of this valve 30, for controlling on/off of flow of the gas discharged from the interior of the space Sa, auxiliary valves 32, 33 connected in parallel to the outlet of the main valve 31, and a mass flow meter (hereinafter referred to as "MFM") 35, connected through a particle trap filter 34 to the outlet of the auxiliary valve 33, for detecting the flow rate of the gas discharged from the interior of the space Sa. The valve outlet of the auxiliary valve 32 and the downstream port of the MFM 35 are connected to the scrubber Sc, whereby the gas discharged from the interior of the space Sa is sent to the scrubber Sc.

A concentration sensor 36 for detecting the concentration of oxygen in the gas discharged from the interior of the space Sa is disposed in the gas exhaust path between the auxiliary valve 32 and MFM 35, and the scrubber Sc. A concentration sensor 37 for detecting the concentrations of hydrogen and oxygen in the gas discharged from the interior of the space Sb is disposed in the gas exhaust path between the gas exhaust port 13 of the chamber 2 and the PCV 24.

Values detected by the above MFM 35, concentration sensors 36, 37, and pressure sensor 60 are sent in the form of electric signals to a control unit 38. Connected to this control unit 38 are an on/off input switch 39 for switching the auxiliary valves 32, 33 between open and close positions thereof, and a monitor 40 for displaying current process conditions on a display screen. The control unit 38 accepts detection signals from the MFM 35 and the concentration sensors 36, 37 and an instruction signal from the input switch 39 and performs predetermined processing based on these signals to output the result of the processing in the form of electric signals to the MFCs 23a, 23b, 28, 29, the auxiliary valves 32, 33, and the monitor 40. Although not illustrated, the control unit 38 also has the function of controlling the heating lamps 9, based on values of temperature detected by the temperature sensors 10, to control the temperature of the Si wafer W.

An example of such processing functions of the control unit 38 will be described below. The control unit 38 has a reactant gas feed setter 38a, an auxiliary valve switching setter 38b, a mixed gas feed setter 38c, and a process continuation-suspension determiner 38d.

First, the reactant gas feed setter 38a controls the flow rates of hydrogen gas Gh and oxygen gas Go supplied into the space Sb, by controlling the MFCs 23a, 23b and the pump 50, based on the detected values by the concentration sensor 37 and/or the pressure sensor 60. This results in controlling the mixture ratio of hydrogen gas Gh and oxygen gas Go (partial pressures of the respective gases) in the space Sb and the total pressure of the reactant gases X to predetermined values. It can also be contemplated that the function of the reactant gas feed setter 38a is not provided in the control unit 38, but in the MFMs 23a, 23b and/or in the pump 50.

The auxiliary valve switching setter 38b outputs to the auxiliary valves 32, 33 such setting signals as to open the auxiliary valve 32 and close the auxiliary valve 33 with an instruction signal of off from the input switch 39, but outputs to the auxiliary valves 32, 33 such setting signals as to close the auxiliary valve 32 and open the auxiliary valve 33 with an instruction signal of on. The auxiliary valves 32, 33 are automatically switched between the open and close positions by simply turning the input switch 39 on or off as described above.

Further, the mixed gas feed setter 38c controls the MFCs 28, 29, based on the detected value by the MFM 35, to regulate the flow rates of oxygen gas and nitrogen gas supplied into the space Sa. The mixed gas feed setter 38c generates setting signals for setting a difference between the flow rate of the mixed gases Gk supplied into the space Sa and the flow rate of the gas discharged from the interior of the space Sa to a predetermined value and outputs them to the MFCs 28, 29. It can also be contemplated that the function of the mixed gas feed setter 38c is not provided in the control unit 38 but in the MFM 35 or in the MFCs 28, 29.

Further, the process continuation-suspension determiner 38d determines, based on the detected values by the concentration sensors 36, 37 and the pressure sensor 60, whether the concentration of oxygen in the gas discharged from the interior of the space Sa, the concentration of oxygen and/or hydrogen in the gas discharged from the interior of the space Sb (the mixture ratio or partial pressures of the two gases), and the total pressure of the reactant gases are in respective predetermined ranges of set values. When either amount is off the corresponding range of set values, the determiner 38d outputs a process suspension signal to the MFCs 23a, 23b, 28, 29 to stop the supply of gases into the chamber 2, thereby suspending the heat treatment of the Si wafer W.

In addition, the process continuation-suspension determiner 38d also outputs the process suspension signal to the monitor 40 upon suspension of the process, whereby process suspension information is displayed on the monitor 40 and an alarm is given in certain cases. It can also be contemplated that the above process suspension signal is sent to each heating lamp 9 to terminate the output of all the heating lamps 9.

A treatment method for forming an oxide film on the Si wafer W by use of the thermal treatment system 1 constructed in the above structure will be described below as a preferred embodiment of the film-forming method according to the present invention.

First, an Si wafer W to be treated is carried by the carry robot (not illustrated) into the chamber 2 the interior of which is replaced or unreplaced with an inert gas or the like. The Si wafer W is desirably one the surface of which was preliminarily cleaned with a cleaner such as diluted hydrofluoric acid or the like. Then the pump 50 is operated in a sealed state of the chamber 2, i.e., in a closed state of the valves 22a, 22b, 27 and the main valve 31 to decrease the pressure inside the chamber 2 (the pressure reducing step). In the film-forming process thereafter, the pump 50 is always operated to maintain the depressurized state. When the interior of the chamber 2 reaches a predetermined pressure, the three support pins 8 are moved up by the lift member 7 to lift the Si wafer W and thereafter the support pins 8 are moved down to mount the Si wafer W on the ring frame 6 of the wafer support member 3 (substrate setting step).

Then the valves 22a, 22b are opened and the control unit 38 sends predetermined flow rate setting signals to the MFCs 23a, 23b to continuously supply the hydrogen gas Gh and oxygen gas Go into the space Sb in the chamber 2 (reactant gas supply step). The two gases are mixed immediately before the gas supply port 12 of the chamber 2 and they flow as reactant gases X in a nonreacting state around the Si wafer in the space Sb, and part thereof is discharged through the gas exhaust port 13.

On the other hand, the valves 27, 30, the main valve 31, and the auxiliary valve 33 are opened, the auxiliary valve 32 is closed, and the control unit 38 sends predetermined flow rate setting signals to the MFCs 28, 29 to continuously supply the mixed gases Gk of oxygen gas and nitrogen gas into the space Sa in the chamber 2. The mixed gas flow from the gas supply port 16 into the space Sa and part thereof is discharged through the gas exhaust port 17. At this time, the possibility of leakage of the mixed gases Gk from the interior of the space Sa into the space Sb is almost zero, because the interior of the space Sa is maintained in a substantially closed state by the deadweight of the Si wafer W and others.

Then, monitoring values detected by the MFM 35, the flow rate of exhaust of the gas from the space Sa is regulated by the valve 30 so that the flow rate of the gases supplied into the space Sa is smaller than the flow rate of the gas discharged from the space Sa. This forces the reactant gases X in the space Sb into the space Sa through a small clearance between the wafer support member 3 and the Si wafer W, thereby creating a closed space of forced fluid.

Then a driving means (not illustrated) rotationally drives the wafer support member 3 to rotate the Si wafer W and the heating lamps 9 are lighted up, approximately at the same time as the above-stated supply of the hydrogen gas Gh, oxygen gas Go, and the mixed gases Gk. This gradually and quickly increases the temperature of the Si wafer W from room temperature (the heating step).

When the temperature of the Si wafer W reaches a predetermined temperature, the reactant gases X burn above the Si wafer W in the space Sb. This generates water and various chemical species being elementary reaction products of the combustion reaction, and the entire surface of the Si wafer W is exposed to these chemical species. At this time, the Si—Si linkage (Si—Si bond) of Si crystal making the Si wafer W dissociates, and Si atoms undergo oxidation to form $SiO_2$. Such oxidation reaction proceeds from the interface to the interior of the Si wafer W, thereby forming a film of $SiO_2$.

On the other hand, an $SiO_2$ film, which suppresses sublimation of silicon suboxide (SiO) being native oxide, is also formed on the surface of the Si wafer W in the space Sa. At this time, the input switch 39 is regularly switched on to let the gas discharged from the interior of the space Sa, flow through the MFM 35. This automatically controls the flow rate of supply of the mixed gases Gk so as to keep the difference at a predetermined value between the flow rate of the gas discharged from the interior of the space Sa and the flow rate of the mixed gases Gk supplied into the space Sa, even with adhesion and deposition of particles and others from the gas onto the valve 30, whereby the gas inside the space Sa is adequately prevented from flowing into the space Sb.

When a predetermined time has elapsed thereafter, the rotation of the Si wafer W is stopped, the heat output from the heating lamps 9 is controlled to a predetermined wafer carry-out temperature (e.g., 750° C.), and the control unit 38 sends a zero flow rate signal to each of the MFCs 22a, 22b, 28, 29 to terminate the supply of the hydrogen gas Gh, oxygen gas Go, and the mixed gases Gk into the chamber 2. After the temperature of the Si wafer W is decreased to the wafer carry-out temperature, the unrepresented carry robot carries the Si wafer W to the outside of the chamber 2.

There are no specific restrictions on the mixture ratio of the hydrogen gas Gh and oxygen gas Go and the mixture ratio is preferably determined so that the hydrogen gas Gh is not less than about 30 vol %, because the film-forming rate becomes adequately high. However, for forming a very thin oxide film, it might be hard to form the film in a desired thickness because of the too large film-forming rate. Therefore, in order to dare to lower the film-forming rate, the mixture rate of hydrogen gas Gh is preferably less than 30 vol %, more preferably 0.1 to 20 vol %, and particularly preferably 0.5 to 5 vol %. This presents the advantage of feasibility of readily forming a very thin film with excellent uniformity of thickness.

The temperature of the Si wafer W (film-forming temperature) is preferably 800 to 1100° C. and more preferably 850 to 1050° C., though it depends upon the mixture ratio of the hydrogen gas Gh and oxygen gas Go. By setting the film-forming temperature in this range, the film-forming rate can be remarkably increased.

Further, the total pressure of the reactant gases X, i.e., the sum of the partial pressures of the hydrogen gas Gh and oxygen gas Go in the space Sb is preferably 0.5 to 2 kPa (about 4 to 15 Torr), more preferably 0.7 to 1.7 kPa (about 5 to 13 Torr), and particularly preferably 0.8 to 1.5 kPa (about 6 to 11 Torr). If this pressure is less than 0.5 kPa, there is a tendency to decrease the concentrations of the hydrogen gas Gh and oxygen gas Go and, in turn, the concentration of chemical species generated by combustion of the two gases so as to fail to accomplish an adequate film-forming rate (reaction efficiency). If the above pressure exceeds 2 kPa on the other hand, there is a tendency to considerably decrease the film-forming rate (reaction efficiency). One of reasons for this is conceivably deactivation due to interaction between chemical species.

In the thermal treatment system 1 as described above and the film-forming method using this thermal treatment system 1, the hydrogen gas Gh and oxygen gas Go flow in a mixed state above the Si wafer W housed in the chamber 2. The Si wafer W is heated by heat radiation from the heating lamps 9, and the combustion reaction of the hydrogen gas Gh and oxygen gas Go and elementary reactions thereof occur immediately above the Si wafer W to generate water and a variety of chemically active reaction species (chemically active species). The surface of the Si wafer W is exposed to these chemically active species and these chemically active species reach the interface (outermost surface) of the Si wafer W. At the interface of the Si wafer W, the Si—Si linkage dissociates and silicon atoms with dangling bonds react with the chemically active species to form the $SiO_2$ film.

At this time, the energy of the chemically active species due to the combustion reaction immediately above the Si wafer W is exerted to the dissociation reaction of Si—Si linkage, and this results in promoting the dissociation reaction and increasing the efficiency of generation of the oxide film at the interface. Namely, the activation energy for formation of the $SiO_2$ film is considered to appear decreased. The chemically active species of oxidizing factors gradually diffuse from the interface into the interior, so that the $SiO_2$ film grows from the interface toward the interior. The behavior of the oxidizing factors is assumed to be different from that in the conventional dry oxidation and wet oxidation by the external combustion method, and the diffusivity and reactivity of the oxidizing factors are considered to be extremely enhanced. As a result, the film-forming rate of the $SiO_2$ film is drastically increased.

Since the whole surface (bulk) of the Si wafer W is exposed to the high concentration of chemically active species to enhance uniformity of chemical reaction and reaction probability between the chemically active species and Si, the $SiO_2$ film formed demonstrates fully excellent uniformity and repeatability of thickness. Further, since the hydrogen gas Gh and oxygen gas Go are burnt immediately above the Si wafer W, i.e., near around the Si wafer W, there is no need for use of the combustion furnace as required in the conventional wet oxidation by the external combustion method. Likewise, there is no need for use of the radical generating system as required in the conventional film formation with radical oxygen. Therefore, the system configuration can be simplified as compared with the conventional methods and systems.

In addition, homogeneity of the oxidation reaction is enhanced across the entire Si wafer W, because the method of the invention does not employ the method of generating water of the oxidizing factor at a remote place from the Si wafer W and transferring it onto the Si wafer W as in the wet oxidation by the external combustion method. Accordingly, the method of the present invention can exhibit adequate reaction controllability for formation of the oxide film with excellent uniformity of thickness.

Further, if the mixture ratio of the hydrogen gas Gh and oxygen gas Go is determined so that the hydrogen gas Gh is not less than about 30 vol %, the film-forming rates can be adequately increased, so as to increase production efficiency in formation of the oxide film on the Si wafer W. If the mixture ratio of the hydrogen gas Gh is less than 30 vol % on the other hand, a very thin film can be formed with excellent adaptivity for thickness and excellent uniformity of thickness, because any film-forming rate can be appropriately selected according to a desired film thickness.

Yet further, if the temperature of the Si wafer W (film-forming temperature) is set in the range of 800 to 1100° C., the production efficiency can be further increased in the process of the oxide film of the Si wafer W, because the film-forming rate can be remarkably increased. In addition, if the total pressure of the reactant gases X is set in the range of 0.5 to 2 kPa (about 4 to 15 Torr), it increases the concentration of the chemically active species generated in the combustion reaction and suppresses the deactivation due to the interaction between the chemically active species, which facilitates attainment of sufficient film-forming rate (reaction efficiency).

In addition, since the valve 30 or the MFCs 28, 29 are operated so that the exhaust flow rate of the gas from the interior of the space Sa is larger than the supply flow rate of the oxygen-containing gas into the space Sa, the mixed gases Gk in the space Sa are fully prevented from entering the interior of the space Sb and negatively affecting the film formation of the SiO$_2$ film on the Si wafer W. Since the gas supply port 16 and gas exhaust port 17 are disposed on the both sides of the sensor setting area in the base section 2a of the chamber 2, even if a blocker exists at a terminal part of each temperature sensor 10, the blocker will flow away together with the gas to be discharged through the gas exhaust port 17. This enhances the stability of temperature detection by the temperature sensors 10.

Another embodiment of the film-forming method with the thermal treatment system 1 will be described below. In the present embodiment, during the initial stage of film formation in the reactant gas supply step of the above-stated embodiment, the film formation at the interface is carried out in a state in which the film-forming rate is lowered by setting the ratio of the hydrogen gas Gh in the reactant gases X to about several vol %. After a lapse of a predetermined time, the MFCs 23a, 23b illustrated in FIG. 3 are then controlled to change the flow rates of the hydrogen gas Gh and oxygen gas Go so as to change the content of the hydrogen gas Gh to about 30 to 35 vol %, while keeping the total pressure of the reactant gases X constant in the space Sb. At this time, the heating lamps 9 continue heating the Si wafer W.

This film-forming method permits the SiO$_2$ layer to be formed with further excellent uniformity at the interface of the Si wafer W and increases the film-forming rate of film formation from the interface to the interior, so as to perform the overall film formation quickly. Therefore, the interfacial oxide film with excellent characteristics can be obtained without decrease in production efficiency, thus permitting attainment of both improvement in characteristics and increase in productivity of the semiconductor device with the oxide film formed as described.

FIGS. 14A to 14E are schematic cross-sectional views to sequentially show the fabrication steps of a preferred embodiment of a semiconductor device according to the present invention. First, a substrate to be treated (see FIG. 14A) is prepared in a stack structure comprising a tunnel oxide film 82 (e.g., 10 nm thick) formed by thermal oxidation and an n-type polysilicon film 83 (e.g., 150 nm thick) formed by the CVD method and implantation of phosphorus in a predetermined concentration on a surface of a p-type silicon substrate 81 having a predetermined surface impurity level (for example, of $10^{17}$ cm$^{-3}$ order).

On the polysilicon film 83 of this substrate, a silicon oxide film 841 is formed, for example, in the thickness of about 5 nm by a high temperature vapor phase growth (HTO) method, in an electric furnace as a film-forming furnace. On the oxide film 841, a silicon nitride film 842 (nitride film) is formed, for example, in the thickness of about 15 nm by the thermal CVD method, the low pressure chemical vapor deposition (LPCVD) method, or the like (see FIG. 14B).

Then this substrate is introduced into the thermal treatment system 1 illustrated in FIGS. 1 and 2 and is subjected to the pressure reducing step, heating step, and reactant gas supply step in the aforementioned film-forming method according to the present invention. This results in exposing the surface of the silicon nitride film 842 to water and a variety of chemically active reaction species (chemically active species) and dissociating the Si—N linkage (bond) in the silicon nitride film 842, whereby silicon oxide (SiO$_2$) is made by reaction between silicon atoms with dangling bonds thus generated, and the chemically active species. This reaction proceeds toward the interior of the silicon nitride film 842 with diffusion of the oxidizing factors, and a silicon oxide film 843 (oxide film) is formed after film formation for a predetermined time (see FIG. 14C).

Figure 14A:
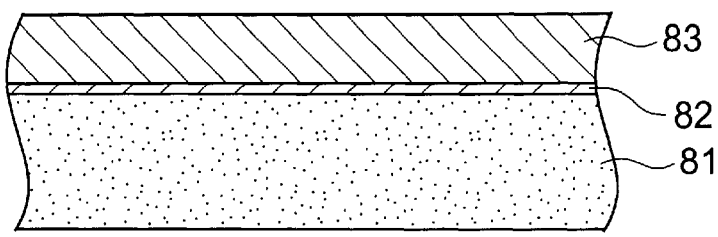
FIGS. 14A to 14E are schematic cross-sectional views to sequentially show fabrication steps of a preferred embodiment of the semiconductor device according to the present invention.
Figure 14B:
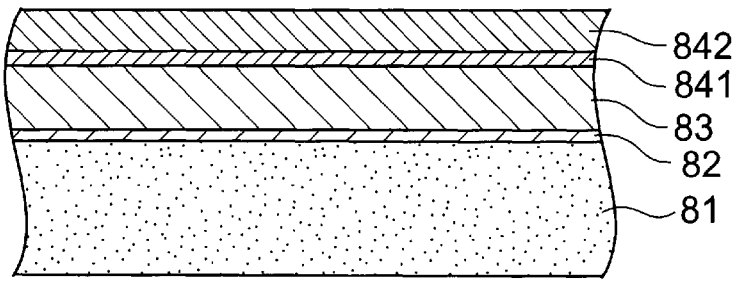
Figure 14C:
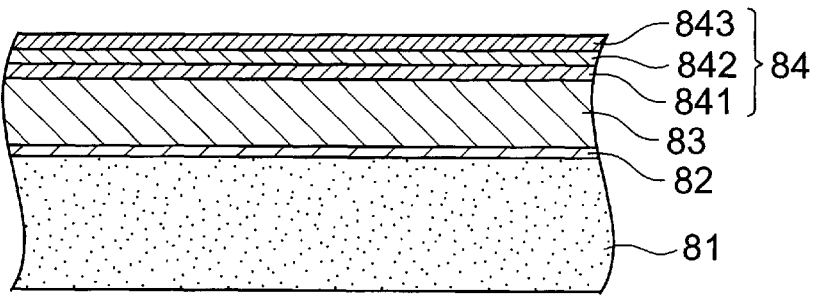
Figure 14D:
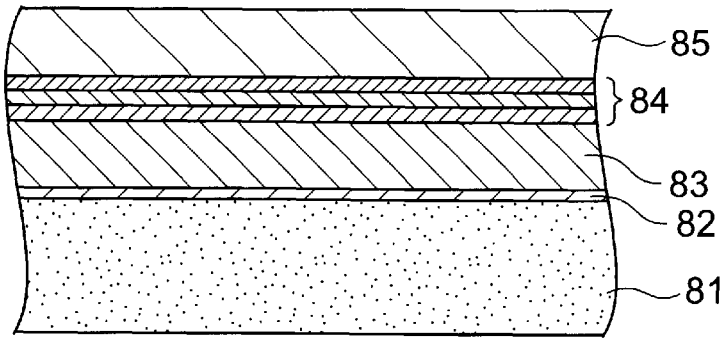
Figure 14E:
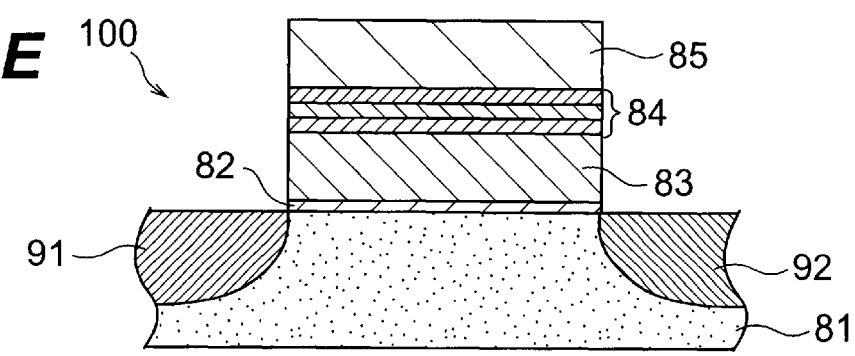

Then a polysilicon film is formed by the CVD method on the insulating film 84 (interelectrode insulating film) having the so-called ONO structure consisting of the silicon oxide film 841, silicon nitride film 842, and silicon oxide film 843 formed as described above, and thereafter phosphorus is made to diffuse into the polysilicon film, thereby forming a polysilicon film 85 (see FIG. 14D). It is optional to further form a silicide film of tungsten silicide, titanium silicide, or the like on this polysilicon film 85.

Then a photoresist film not illustrated is patterned in a predetermined pattern; the polysilicon film 85, insulating film 84, polysilicon film 83, and tunnel oxide film 82 are successively subjected to etching; and then the photoresist film is removed. Further, a source region 91 is formed in a predetermined exposed portion of the silicon substrate 81 by implantation of phosphorus ions by an ordinary method and a thermal treatment, while a drain region 92 is formed in a predetermined portion of the silicon substrate 81 by implantation of arsenic ions and a thermal treatment (see FIG. 14E). After this, predetermined various connection lines, other insulating films, etc. are formed, thereby fabricating a nonvolatile memory 100 (semiconductor device) with the polysilicon films 83, 85 after the etching, as a floating gate electrode (denoted by numeral 83 in the figure) and as a control gate electrode (denoted by numeral 85 in the figure), respectively.

Figure 15:
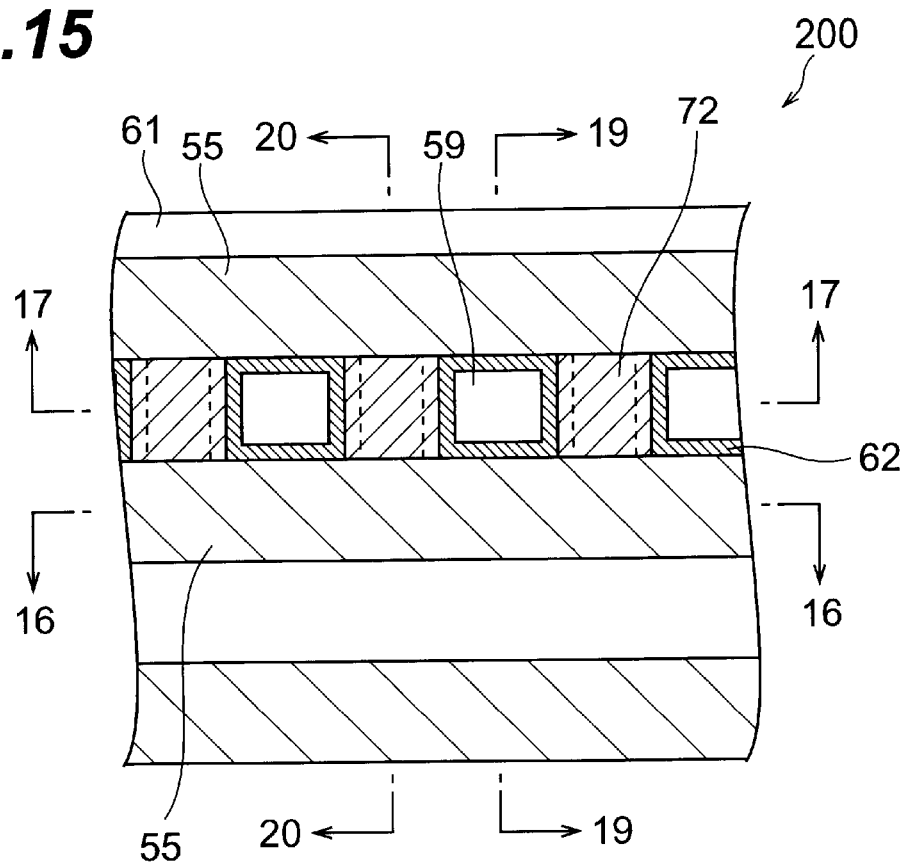
FIG. 15 is a schematic plan view to show a part of another embodiment of the semiconductor device according to the present invention.

Next, another embodiment of a semiconductor device according to the present invention and a fabrication method thereof will be described below with reference to FIGS. 15 to 19. FIG. 15 is a schematic plan view to show a portion of another embodiment of the semiconductor device according to the present invention and FIGS. 16 and 17 are schematic cross-sectional views along respective arrows illustrated in FIG. 15.

Figure 16:
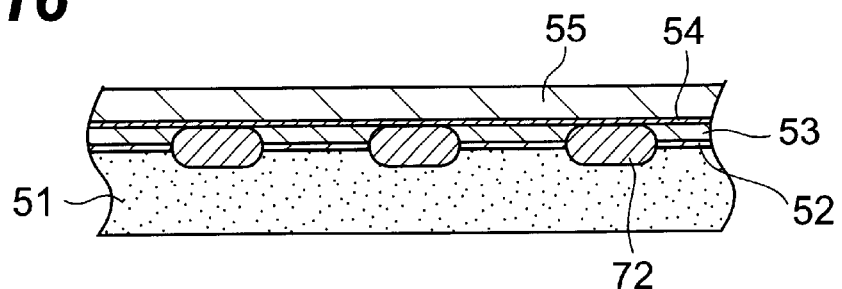
FIG. 16 is a schematic cross-sectional view along arrows illustrated in FIG. 15.
Figure 17:
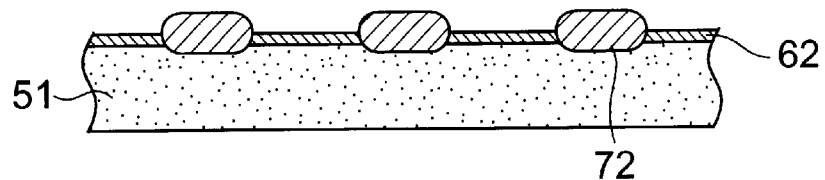
FIG. 17 is a schematic cross-sectional view along arrows illustrated in FIG. 15.

As shown in FIGS. 15 to 17, a nonvolatile memory 200 is comprised of one EEPROM in which 1-bit memory cells are formed on a p-type silicon substrate 51 having a predetermined surface impurity concentration (for example, of $10^{17}$ cm$^{-3}$ order). This memory cell consists of an n-type source region 61 and an n-type drain region 62 formed in a device forming area on the surface of the silicon substrate 51, a field oxide film 72 formed in a device isolation area thereof, and a tunnel oxide film 52, a floating gate electrode 53, an insulating film 54 (interelectrode insulating film), and a control gate electrode 55 successively stacked on the silicon substrate 51.

An example of a method of fabricating the nonvolatile memory 200 in this structure will be described below. FIGS. 18A to 18E, FIGS. 19A to 19E, and FIGS. 20A to 20E are schematic cross-sectional views to sequentially show the fabrication steps of the embodiment of the semiconductor device according to the present invention and schematic cross-sectional views along respective arrows illustrated in FIG. 15.

First, LOCOS type field oxide films 72 are formed in a predetermined thickness (e.g., 500 to 600 nm) in the device isolation areas of a grating pattern having desired intervals in a predetermined direction (for example, the lateral direction of orientation (100)) on the surface of the p-type silicon substrate 51 and extending in the direction perpendicular to the predetermined direction (for example, the vertical direction of orientation (100)). Tunnel oxide films 52 are formed in a predetermined thickness (e.g., about 10 nm), for example, by thermal oxidation in the device forming areas between the device isolation areas.

Figure 18A:
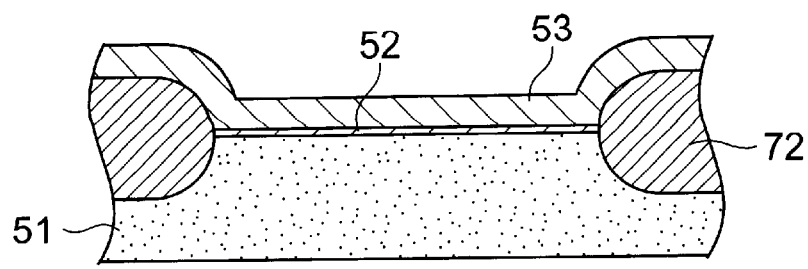
FIGS. 18A to 18E are schematic cross-sectional views to sequentially show fabrication steps of another embodiment of the semiconductor device according to the present invention.
Figure 18B:
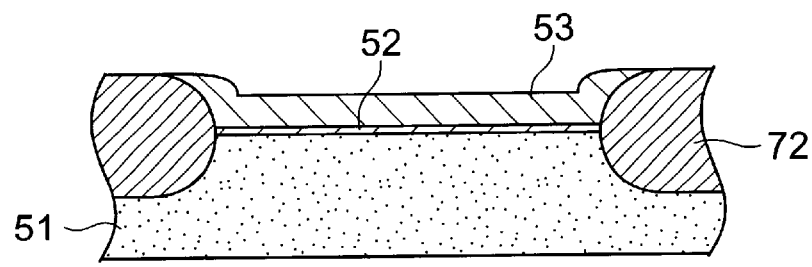
Figure 19A:
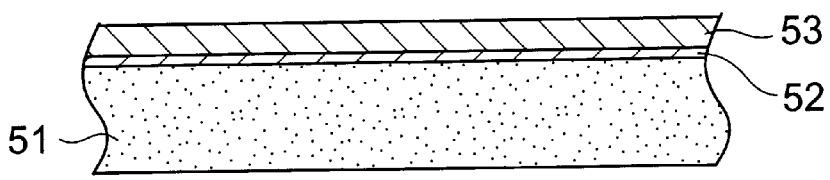
FIGS. 19A to 19E are schematic cross-sectional views to sequentially show the fabrication steps of another embodiment of the semiconductor device according to the present invention.
Figure 19B:
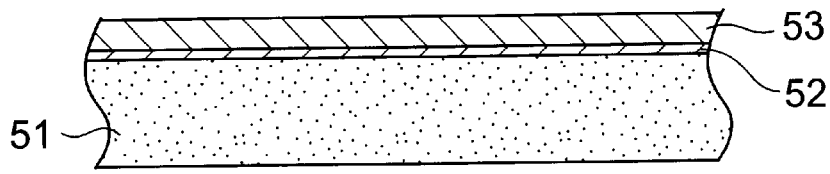
Figure 20A:
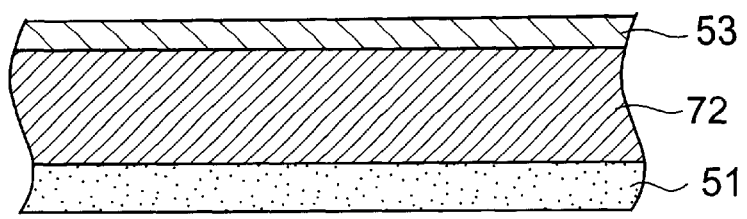
FIGS. 20A to 20E are schematic cross-sectional views to sequentially show the fabrication steps of another embodiment of the semiconductor device according to the present invention.
Figure 20B:
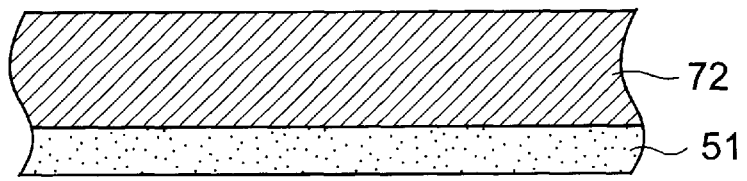

Then a polysilicon film is grown in a predetermined thickness (e.g., about 100 to 150 nm) by the CVD method and phosphorus ions are injected into this polysilicon film up to a predetermined concentration, thereby forming an n-type polysilicon film (hereinafter referred to as "polysilicon film 53") to become the floating gate electrodes 53 (see FIGS. 18A, 19A, and 20A). Further, the surface of this polysilicon film 53 is polished by a predetermined amount to effect leveling to remove the polysilicon film 53 on the field oxide films 72, thereby placing polysilicon films 53 between the field oxide films 72 (see FIGS. 18B, 19B, and 20B).

After that, an insulating film 54 is formed by a method similar to the formation of the insulating film 84 shown in FIGS. 14A–14E. Namely, first, a silicon oxide film of a predetermined thickness (e.g., about 5 nm) and a silicon nitride film (nitride film) of a predetermined thickness (e.g., about 15 nm) are successively formed by the HTO method and by the thermal CVD method or LPCVD method, respectively. Then this silicon nitride film is oxidized by the film-forming method of the present invention to convert part of silicon nitride into silicon oxide, thereby forming a silicon oxide film (oxide film) of a predetermined thickness (e.g., 5 nm) on the silicon nitride film. This ends up forming the insulating film 54 having the ONO structure.

Figure 18C:
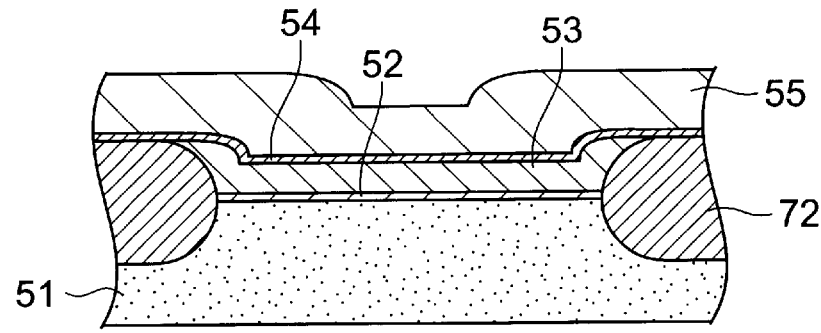
Figure 19C:
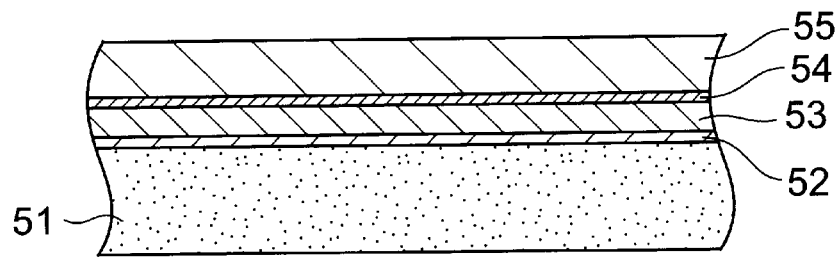
Figure 20C:
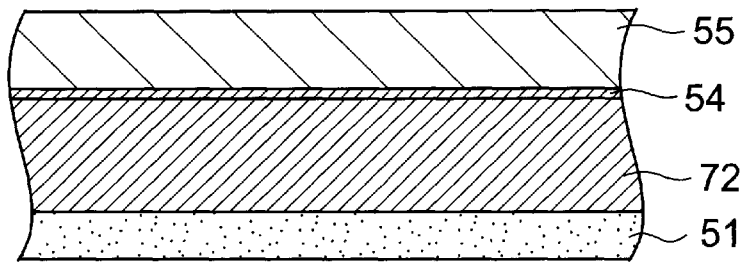

Then a polysilicon film is grown into a predetermined thickness (e.g., about 100 to 150 nm) on this insulating film 54 and phosphorus is diffused into the polysilicon film to form a polysilicon film with low resistance (hereinafter referred to as "polysilicon film 55") to become the control gate electrodes 55 (see FIGS. 18C, 19C, and 20C). The surface of the polysilicon film 55 may be subjected to sputtering of tungsten silicide, titanium silicide, or the like, thereby forming a polysilicon/silicide stack film.

Figure 18D:
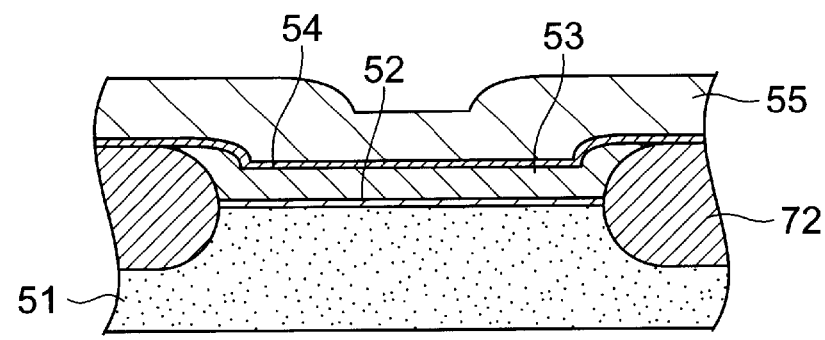
Figure 18E:
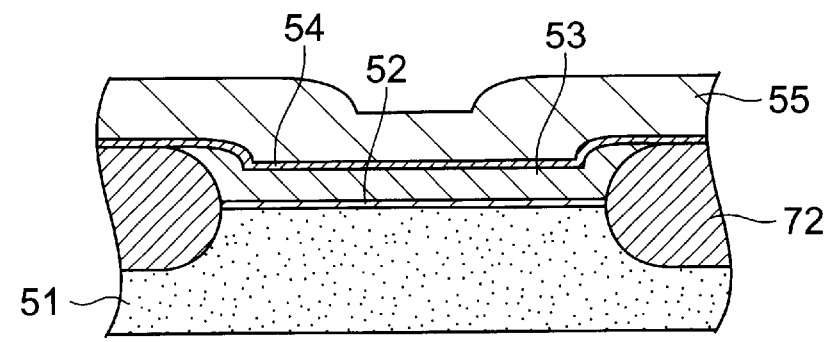
Figure 19D:
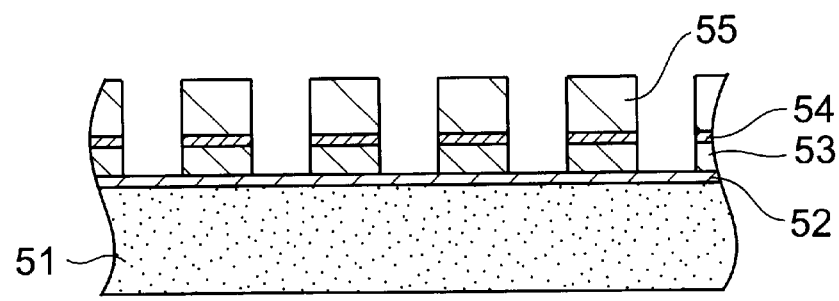
Figure 19E:
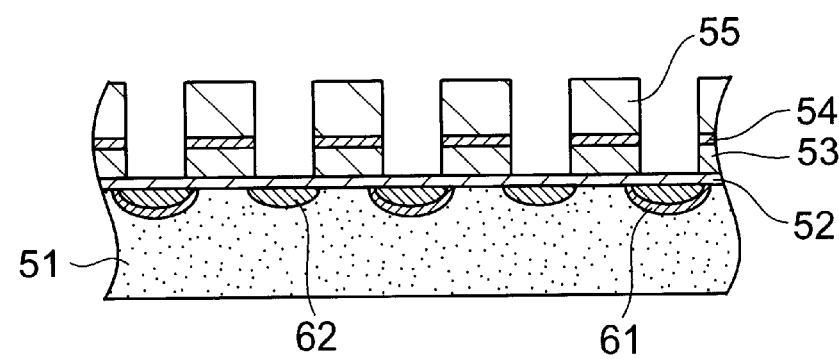
Figure 20D:
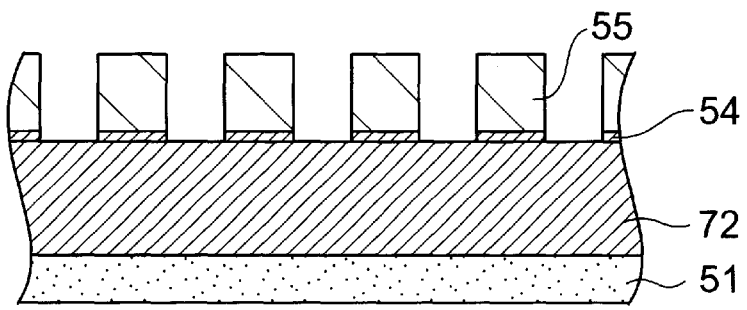
Figure 20E:
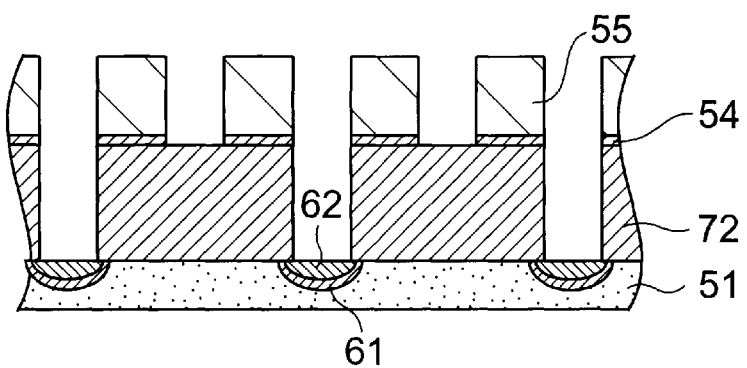

Then a photoresist film having a predetermined pattern is formed (not illustrated) and, using it as a mask, the polysilicon film 55, insulating film 54, and polysilicon film 53 are successively subjected to anisotropic etching (see FIGS. 18D, 19D, and 20D). After this etching, the remaining portions of the polysilicon films 53, 55 become the floating gate electrodes 53 and control gate electrodes 55. Further, the resist film is removed by plasma ashing or the like, exposed portions of the tunnel oxide films 52 are etched, and thereafter silicon oxide films (not illustrated) are formed in a predetermined thickness (e.g., about 10 nm) on side faces of the floating gate electrodes 53 and control gate electrodes 55 by thermal oxidation or the like.

After that, a photoresist film of a predetermined pattern (not illustrated) is formed, exposed portions of the field oxide films 72 are etched, and thereafter phosphorus and arsenic ions are injected into exposed portions of the silicon substrate 51. Source regions 61 are formed by removing this photoresist film pattern and then carrying out a thermal treatment. In the next place, a photoresist film (not illustrated) having a predetermined pattern different from the previous one is formed and then arsenic ions are injected into the exposed portions of the field oxide films. Drain regions 62 are formed by removing this photoresist film pattern and then carrying out a thermal treatment (see FIGS. 18E, 19E, and 20E).

After that, the nonvolatile memory (cells) 200 is fabricated by forming an interlayer insulating film (not illustrated), forming contacts 59 for connection lines connected to the drain regions 62, and further forming the connection lines and others.

In the embodiments of the fabrication methods of the semiconductor devices according to the present invention and the nonvolatile memories 100, 200 fabricated thereby as described above, particularly, the characteristics of the insulating films 54, 84 can be improved in the following respects. First, it was verified that the film-forming rate in the oxidation of the nitride film by the film-forming method according to the present invention was increased to a much higher level than by the conventional wet oxidation. In addition, a similar tendency was observed even if the film-forming temperature was reduced to a lower temperature than in the wet oxidation.

This is conceivably because the energy of the chemically active species due to the combustion reaction immediately above the silicon nitride film 842 is exerted to the dissociation reaction of Si—N linkage (bond), similar to the aforementioned oxidation of Si wafer, and it results in promoting the dissociation reaction and increasing the production efficiency of the silicon oxide film 843 at the interface. Namely, it is assumed that the activation energy of chemical change of the silicon nitride film 842 into the silicon oxide film 843 appears reduced.

The chemically active species of oxidizing factors gradually diffuse from the interface into the interior, so that the silicon oxide film 843 grows from the interface toward the interior. At this time, the diffusivity and reactivity of the oxidizing factors is extremely enhanced, as compared with the conventional wet oxidation, so that the film-forming rate of the silicon oxide film 843 is considered to be remarkably increased. However, the action is not limited to this.

Since the film-forming rate of the silicon oxide film 843 can be increased even with decrease in the film-forming temperature from those before, the quantity of input heat into the silicon substrate 51, 81, i.e., the thermal load on the silicon substrate 51, 81 can be remarkably reduced. Accordingly, thermal stress is relieved on the silicon substrate 51, 81, so as to fully reduce accumulation of distortion and residual stress due to it. As a result, it becomes feasible to fully suppress occurrence of shape change, deformation, etc. such as warpage or the like of the silicon substrate 51, 81 and thus to enhance the reliability of the nonvolatile memory 100, 200. In addition, since the film-forming time of the insulating film 54, 84 can be decreased, it is feasible to reduce work manhours.

Further, since the conventional wet oxidation necessitated the long-hour film formation with constraints on the film-forming temperature, there was such a tendency that polysilicon crystals varied in the lower part of film and the lifetime of the tunnel oxide film became shorter. In contrast with it, since the present invention permits the insulating film 54, 84 to be formed by the relatively low-temperature and short-time thermal treatment as described above, it can adequately prevent change of the polysilicon structure of the floating gate electrode 53, 83 (crystallinity etc.) and deterioration of the tunnel oxide film 52, 82. This can improve the rewriting reliability of the nonvolatile memory 100, 200 and increase the number of rewrite operations; or, it can prevent decrease in the number of rewrite operations.

The formation of the silicon oxide film 843 according to the present invention can obviate one deposition step, as compared with the method of forming the silicon oxide film on the silicon nitride film 842 by the CVD method (HTO method), i.e., the formation of the three-layer structure by deposition of the layers. This improves the productivity, as compared with the case of formation of the insulating film 54, 84 by only the CVD method and, more specifically, it can accomplish reduction in the system scale, cost reduction based thereon, and simplification of steps. The present invention also provides the advantage of decreasing particles in film, as compared with the CVD method.

Further, the dispersion of thickness of the insulating film 54, 84 is dependent upon only dispersion of only two layers of the silicon oxide film 841 and silicon nitride film 842. In contrast with it, according to the CVD method for further depositing the silicon oxide film on the silicon nitride film 842, the dispersion of thickness of the insulating film 54, 84 includes dispersion of thickness of the three layers. Therefore, uniformity of thickness can be improved as compared with the insulating film formed by only the CVD method. Accordingly, the thickness of the insulating film 54, 84 can be made thinner, whereby it becomes feasible to adequately adapt for scaledown of semiconductor devices.

Yet further, the CVD method requires control of plural fabrication parameters, e.g., the source gases and film-forming temperature, for controlling the quality of film, whereas only the temperature needs to be controlled in the forming process of the silicon oxide film 843 according to the present invention, because the rate of the film-forming reaction is determined by diffusion. Therefore, controllability is improved in the quality of the silicon oxide film 843. This readily and surely realizes thinning of the insulating film 54, 84 and further prevents degradation of uniformity of thickness.

The preferred embodiments of the present invention were described above, but it is needless to mention that the present invention is by no means limited to these embodiments. For example, an organic gas containing hydrogen in molecules, such as methane gas or the like, can be used as the first gas to be supplied into the space Sb, and the gases can be properly selected from gases suitable for the type of the substrate and the formation of desired thin film as long as they are gases capable of generating energy by reaction between the first gas and the second gas. Instead of mixing the hydrogen gas Gh and oxygen gas Go immediately before the gas supply port 12, they may be introduced independently through the gas supply port 12 into the chamber 2 and be mixed in the chamber 2.

Further, the mixed gases Gk supplied into the space Sa can be a mixture of oxygen gas or the like with a rare gas such as argon (Ar) or the like, instead of the oxygen gas and nitrogen gas, or can be mixed gases similar to the first gas and the second gas supplied into the space Sb. Yet further, it is not always necessary to form the space Sa in the chamber 2 and/or to supply the mixed gases Gk into the space Sa so as to flow therein. In such cases, the Si wafer W may be supported by use of an ordinary susceptor instead of the wafer support member 3 and the heating section can be constructed by providing this susceptor with a heat source such as a heater instead of the heating lamps 9. Such a susceptor will serve as a support section and as a heating section. Further, in the case wherein the mixed gases Gk are not supplied into the space Sa, the interior of the chamber 2 may be depressurized after the Si wafer W is mounted on the wafer support member 3.

The system may be constructed with only either one of the valve 30 and the MFCs 28, 29 or such means do not have to be provided in particular in the case wherein the mixed gases Gk in the space Sa rarely leak into the space Sb because of the deadweight of the Si wafer W and others. Further, it is also possible to manually switch the auxiliary valves 32, 33 individually between the open and close positions, without provision of the input switch 39. Further, the mixed gas exhaust system 19 was provided with two exhaust lines, but only one exhaust line may suffice. Yet further, the concentration sensors 36, 37 may be omitted depending upon circumstances.

The source region 61, 91 and the drain region 62, 92 may be preliminarily formed in the silicon substrate 51, 81, prior to the formation of the polysilicon film becoming the floating gate electrode 53, 83. Further, the insulating film 54, 84 is not limited to the IPD (InterPolyDielectric) film having the three-layer structure of ONO, but it can be a film having at least one nitride film and at least one oxide film continuously formed by oxidation of the nitride film after formation of the nitride film.

Moreover, the fabrication methods of the semiconductor devices according to the present invention are not limited to the fabrication of the nonvolatile memories 100, 200, but they can be commonly applied to formation of the interelectrode insulating film in semiconductor devices with the interelectrode insulating film including the nitride film. Still further, the semiconductor devices of the present invention are not limited to the nonvolatile memories 100, 200, but they can be those having the interelectrode insulating film formed by the film-forming method of the present invention and those fabricated by the semiconductor fabrication method of the present invention.

An example of such other semiconductor devices is the nonvolatile memory fabricated in the same manner as the fabrication method of the nonvolatile memory described in Japanese Patent Application Laid-Open No. H11-265987, except that the IPD film is formed in the same manner as the insulating film 84 illustrated in FIGS. 14A to 14E. Still another semiconductor device is the nonvolatile memory having the structure equivalent to the nonvolatile memory described in Japanese Patent Application Laid-Open No. H07-312394, except that the insulating film having the structure similar to the insulating film 84 illustrated in FIGS. 14A to 14E is placed instead of the silicon oxide film interposed between the floating gate and control gate electrodes.

The cell structure of the nonvolatile memory can be either of so-called three-layer polysilicon type, NOR type, DINOR type, AND type, NAND type, SEEQ type, ACEE type, SanDisk type, SST type, and so on. Further, the semiconductor devices according to the present invention do no always have to be the nonvolatile memories such as the EEPROM or the like, but they can be, for example, capacitors and the like as long as they have the interelectrode insulating film formed by the film-forming method of the present invention. Moreover, the film-forming method according to the present invention may be applied instead of the thermal oxidation.

EXAMPLES

The present invention will be described hereinafter in more detail on the basis of examples thereof, but it is noted that the present invention is by no means intended to be limited to those examples.

Examples 1 and 2

The substrate to be treated was an Si (crystalline direction, orientation: 100) wafer (diameter of effective surface: 200 mm), the surface of this Si wafer was cleaned with diluted hydrofluoric acid as a pretreatment, and the substrate was set in the chamber 2 of the thermal treatment system 1 in the structure illustrated in FIG. 1 and mounted on the wafer support member 3. The interior of the chamber 2 was depressurized and thereafter the Si wafer was quickly heated from the top by the heating lamps up to a predetermined film-forming temperature while continuously supplying the oxygen gas and hydrogen gas as reactant gases into the chamber 2. The film-forming temperature was measured at six positions in the radial directions from the back of the Si wafer with the optical sensors and uniformity of temperature of the Si wafer surface was controlled based on these temperature measurements. Table 1 shows the total pressure of the reactant gases and the mixture ratio of oxygen gas and hydrogen gas in each example.

TABLE 1

| | Ratio of reactant gases (vol %) | | Total pressure of |
|---|---|---|---|
| | $H_2$ gas | $O_2$ gas | reactant gases |
| Example 1 | 2 | 98 | 1.33 kPa (10 Torr) |
| Example 2 | 33 | 67 | 1.33 kPa (10 Torr) |
| Comparative Example 1 | 0 | 100 | 1.33 kPa (10 Torr) |
| Comparative Example 2 | 0 | 100 | 101 kPa (760 Torr) |

Under the reactant gas conditions presented in Table 1, $SiO_2$ films as oxide films were formed with variations in film-forming time (oxidation time) and film-forming temperature. After completion of film formation, film thicknesses of the Si wafers (thicknesses of oxide films) were measured. As a result, under the circular measurement conditions at 49 points excluding the peripheral part of 3 mm, the standard deviation (3σ) with respect to average was not more than 0.5% at either of oxidation times and film-forming temperatures in both Examples 1 and 2. It was thus verified that the present invention was able to achieve sufficient thickness uniformity. The like oxidation treatment was carried out for five thousand Si wafers of the same shape and the like thickness measurement was conducted. As a result, dispersion of average of thickness at the same oxidation time was not more than 1.5% (standard deviation 3σ). This verified that the present invention was able to achieve extremely excellent repeatability of thickness.

Comparative Examples 1 and 2

The oxidation treatment of Si wafer surface was carried out in the same manner as in Examples 1 and 2, except that only oxygen gas was used as reactant gas, the total pressure of the reactant gas was set according to the conditions presented in Table 1, and the oxidation time and film-forming temperature were different in part (RTO process). After completion of the film formation, the uniformity and repeatability of thickness was evaluated in the same manner as in Examples 1 and 2 and the standard deviation was similar to that in Examples at either of the film-forming times and film-forming temperatures in both Comparative Examples 1 and 2. This proved that the film-forming method and system of the present invention realized the thickness uniformity and repeatability equivalent to those by the conventional dry oxidation.

<Consideration on Film-Forming Time and Thickness of Oxide Film>

Figure 4:
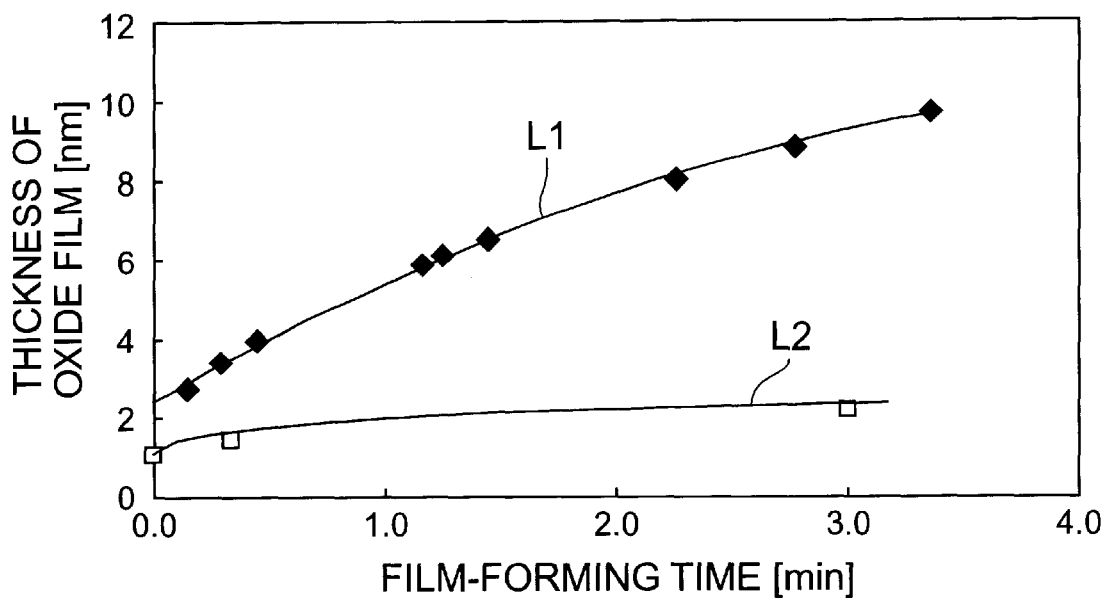
FIG. 4 is a graph to show the relationship between film-forming time and thickness in Example 1 and Comparative Example 1.

FIG. 4 is a graph to show the relation between film-forming time and thickness in Example 1 and Comparative Example 1. Curves L1, L2 are curves resulting from function fitting for the data of Example 1 and Comparative Example 1, respectively. It was clarified by this figure that the film-forming rate (oxidation rate) of Example 1 was a little larger than about four times that of Comparative Example 1 and that the film-forming method of the present invention extremely increased the oxidation reactivity as compared with the conventional dry oxidation.

The inventors attempted to estimate an increase of film-forming rate in the case wherein the hydrogen gas (2 vol %) in Example 1 was converted all into water, by the reaction model of Deal-Grove (Document: B. E. Deal, and A. S. Grove, J. Appl. phys., 36, (1965) 3770) commonly accepted (the model will be referred to hereinafter as "Deal-Grove model"). However, the results according to this reaction model were such that increases of film-forming rate seen under the total pressure conditions of Example 1 and Comparative Example 1 were extremely small (not more than 0.1 nm) for both of the dry oxidation as in Comparative Example 1 and the wet oxidation by the external combustion method. This proved that the Deal-Grove model failed to explain the increase of film-forming rate of Example 1 against Comparative Example 1.

Figure 5:
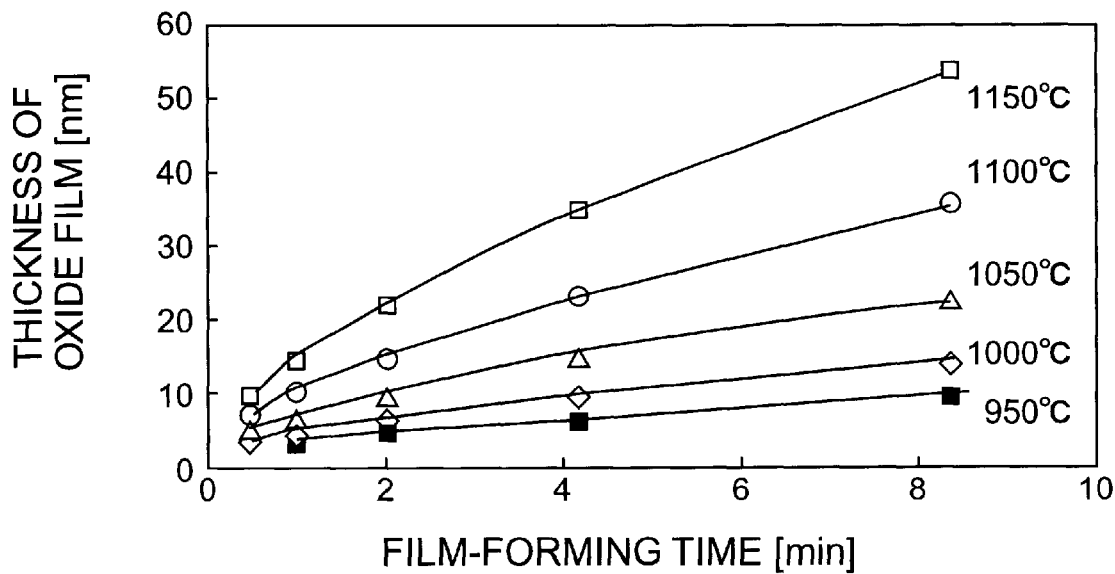
FIG. 5 is a graph to show the relationship between film-forming time and thickness in Comparative Example 2.
Figure 6:
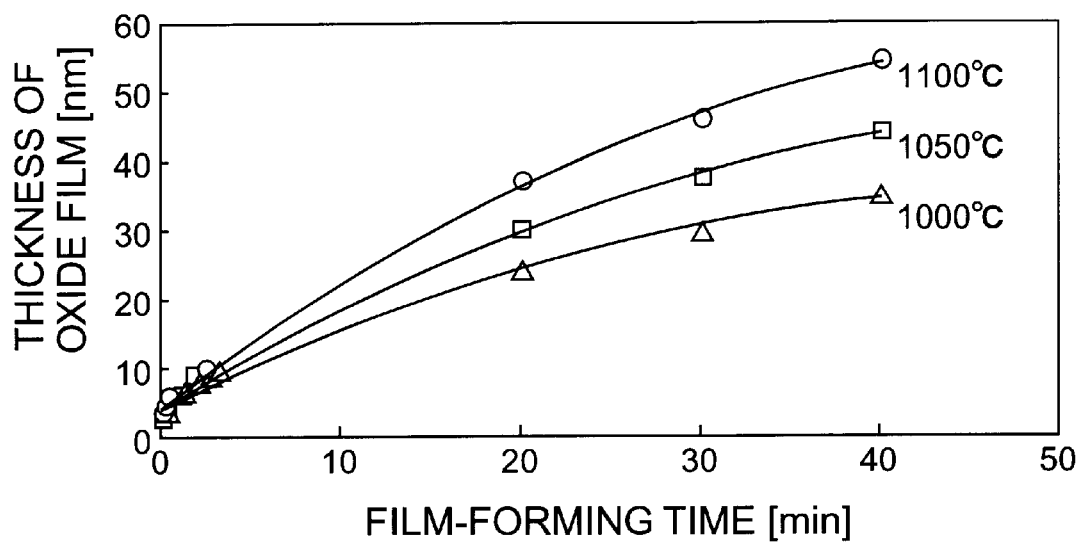
FIG. 6 is a graph to show the relationship between film-forming time and thickness in Example 1.
Figure 7:
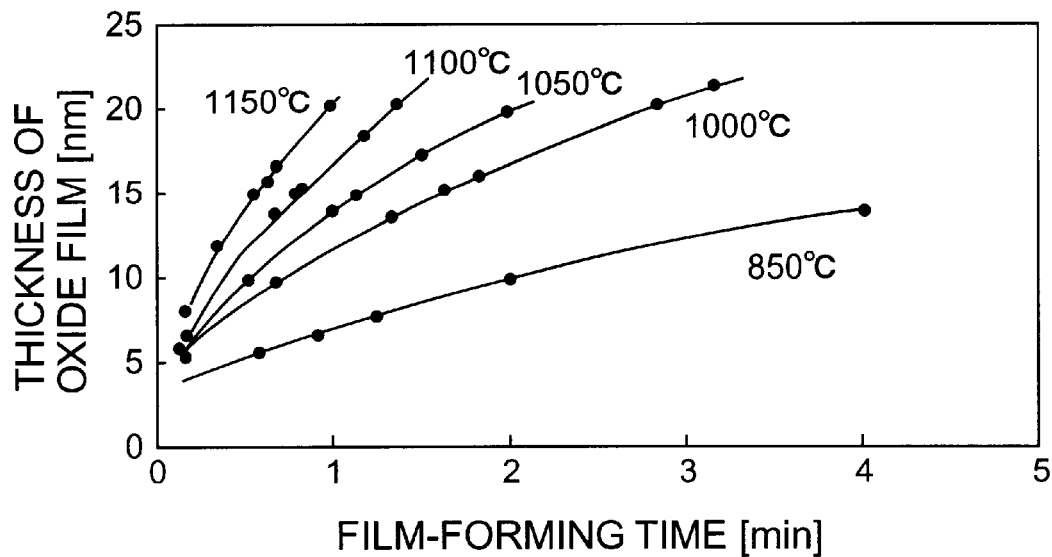
FIG. 7 is a graph to show the relationship between film-forming time and thickness in Example 2.

Then whether the formation of oxide film in Examples 1 and 2 follows this Deal-Grove model was investigated based on the Kamigaki's technique (Document: Y. Kamigaki, and Y. Itoh, Lpn. Appl. Phys., 48 (1977) 2891). FIGS. 5 to 7 are graphs to show the relations between film-forming time and thickness in Comparative Example 2, and Examples 1 and 2, respectively. In each figure a plurality of curves represent results under different film-forming temperature conditions. Here the above-mentioned Deal-Grove model is generally expressed by Eq. (1) below;

$$D^2 + AD = B(t+\tau) \qquad (1).$$

In the equation, t represents the film-forming time (oxidation time), D the thickness, and B a rate constant in a parabolic region of graph. The value of A/B indicates a rate constant in a linear region of graph, and τ a time correction of initial oxidation.

On the other hand, the graphs illustrated in FIGS. 5 to 7 all are well approximated to quadratic functions represented by Eq. (2) below;

$$t = a_0 + a_1 \cdot x + a_2 \cdot x^2 \tag{2}$$

[where t represents the film-forming time, d the thickness, and $a_0$, $a_1$, and $a_2$ constants]. Correlation coefficients in least square fitting were 0.994 to 1.000 in Examples 1 and 2 (FIGS. 6 and 7), and 0.998 to 1.000 in Comparative Example 2. Thus correlation was very good.

Among inverses of the respective constants obtained by the fitting of above Eq. (2), $1/a_1$ and $1/a_2$ are equivalent to the B value and B/A value, respectively, in the Deal-Grove model equation represented by Eq. (1). Table 2 presents values of $1/a_1$ and $1/a_2$ obtained by fitting of Eq. (2) to the data shown in FIGS. 5 to 7, and document values of the B value and B/A value of aforementioned Deal-Grove. In the table "DG" represents the document values of Deal-Grove at the total pressure of reactant gas of 101 kPa (760 Torr) for the Si wafer (crystalline direction, orientation: 111).

TABLE 2

|  | $1/a_2$ (nm²/min) | B (nm²/min) | $1/a_1$ (nm/min) | B/A (nm/min) |
|---|---|---|---|---|
| Comparative Example 2 | 2.85 | — | 8.02 | — |
| Example 1 | 0.95 | — | 5.63 | — |
| Example 2 | 3.33 | — | 17.29 | — |
| DG (dry) | — | 2.70 | — | 5 |
| DG (wet) | — | 86.6 | — | 76 |

Although the comparison is made with the Si wafers of the (111) direction (orientation) as described above, Table 2 shows that $1/a_1$ and $1/a_2$ of Comparative Example 2 were values approximately close to the values in the dry oxidation of the Deal-Grove model. In contrast with it, $1/a_1$ and $1/a_2$ of Example 2 were values significantly larger than those of Comparative Example 2.

According to the Deal-Grove model, the aforementioned B value is in a proportional relation to the concentration of reactant gas. Thus, assuming that the hydrogen gas in Examples 1 and 2 were converted all into water, values corresponding to the total pressure of reactant gas of 101 kPa (760 Torr) of the Deal-Grove model were computed from the $1/a_2$ values of Examples 1 and 2 (0.95 and 3.33, respectively, from Table 2) according to Eqs. (3) and (4) below.

DG equivalent value of the $1/a_2$ value of Example 1 (hydrogen gas 2 vol %, total pressure 0.133 kPa (10 Torr))=0.95×760/10/0.02=3610 (nm²/min) (3)

DG equivalent value of the $1/a_2$ value of Example 2 (hydrogen gas 33 vol %, total pressure 0.133 kPa (10 Torr))=3.33×760/10/0.33=767 (nm²/min) (4)

These values obtained are greater than the B value of 86.6 (nm²/min) in the wet oxidation of the Deal-Grove model presented in Table 2. Increase in the B value of the Deal-Grove model means increase in a feed of reaction species associated with the reaction from the reactant gases, or large diffusion constants of the reaction species into the wafer. Taking this into consideration, it is considered that the results of above Eqs. (3) and (4) suggest that reaction mechanisms are different from each other between the film-forming reaction in Examples 1 and 2 and the wet oxidation reaction of the Deal-Grove model.

Then, using the approximate curves of the function form of Eq. (2) obtained in FIGS. 5 to 7, the inventors conducted the analysis of power for the film-forming rates of the oxide films formed in Comparative Example 2 and in Examples 1 and 2.

First, when change of film-forming rate is expressed by Eq. (5) below;

$$dx/dt = 1/(x^{n-1}) \tag{5}$$

[where dx and dt represent infinitesimal increments of thickness and film-forming time, respectively, and n the power], the value n in the equation is given by Eq. (6) below;

$$n = 1 + (2 \cdot a_2 \cdot X)/(a_1 + 2 \cdot a_2 \cdot X) \tag{6}$$

(reference is made to the aforementioned Deal-Grove document).

Figure 8:
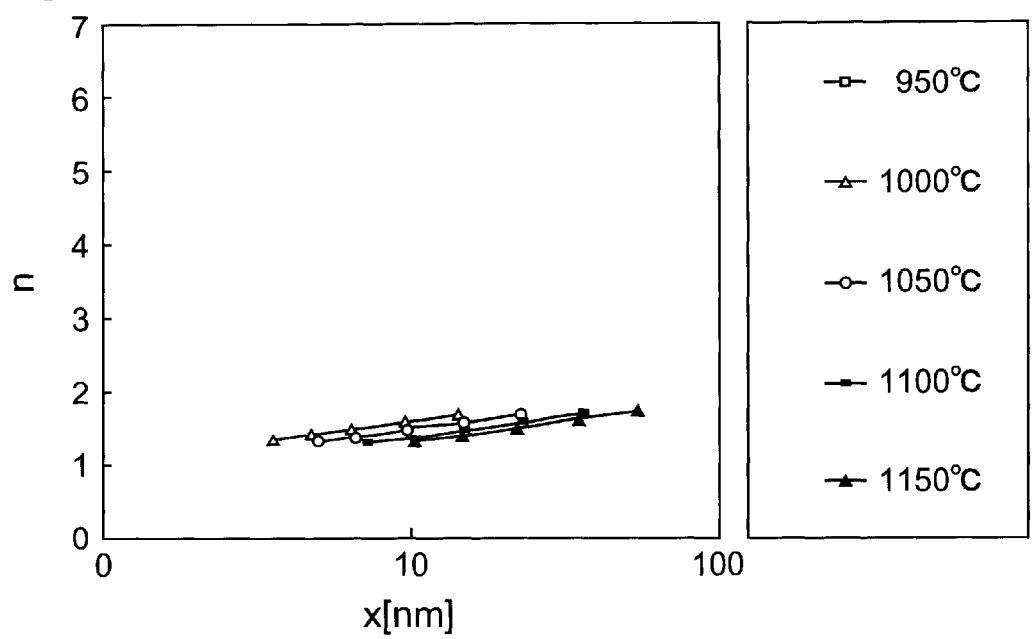
FIG. 8 is a graph to show n-value against thickness X of oxide films formed in Comparative Example 2.
Figure 9:
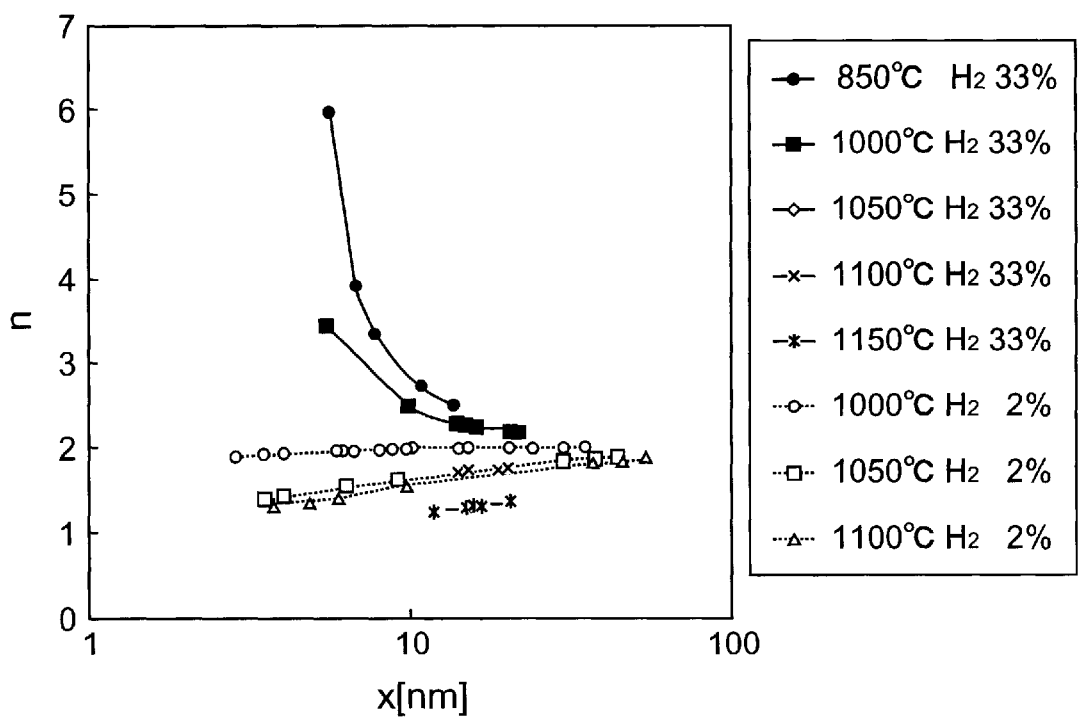
FIG. 9 is a graph to show n-value against thickness X of oxide films formed in Examples 1 and 2.

The values n obtained by this Eq. (6) are presented in FIGS. 8 and 9. FIG. 8 is a graph to show the n-value against thickness X of the oxide films formed in Comparative Example 2. FIG. 9 is a graph to show the n-value against thickness X of the oxide films formed in Examples 1 and 2. In the figures the curves correspond to respective oxide films formed at different film-forming temperatures.

It was verified from FIG. 8 that in the case of Comparative Example 2 by the dry oxidation, the n-values were in the range of 1 to 2 and followed the Deal-Grove model (i.e., Eq. (1)). On the other hand, it was confirmed that most data of the n-values of Examples 1 and 2 were in the range of 1 to 2 but the n-values at the film-forming temperatures of 850° C. and 1000° C. in Example 2 (hydrogen gas 3 vol %) were not less than 2 and did not follow the Deal-Grove model.

Figure 10:
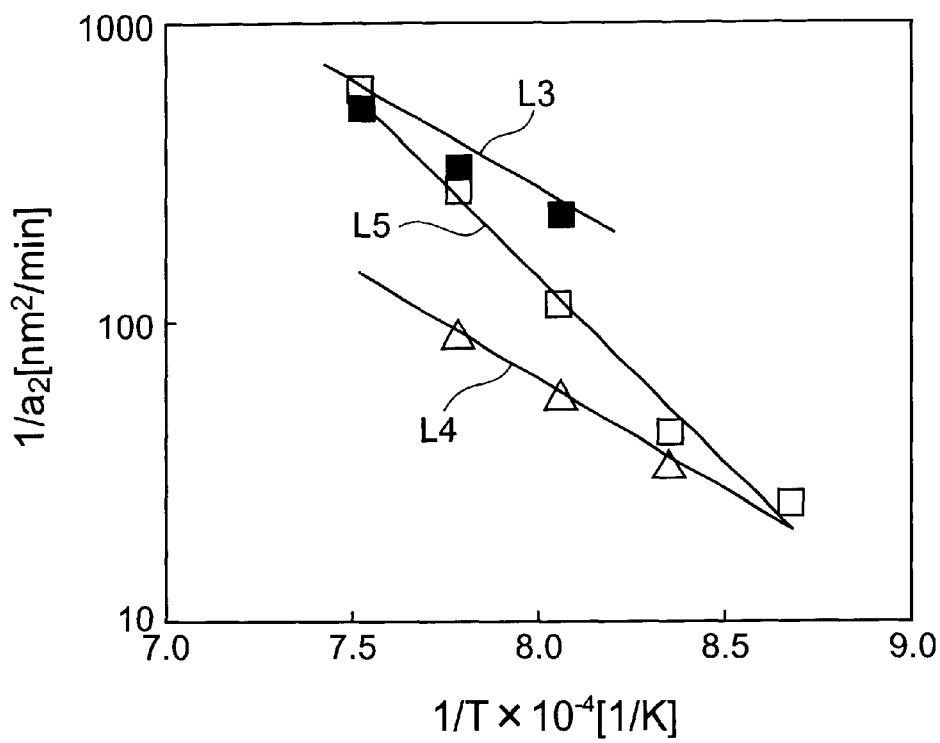
FIG. 10 is a graph to show changes of $1/a_2$ against inverse of film-forming temperature T(K) in Examples 1 and 2 and in Comparative Example 1.
Figure 11:
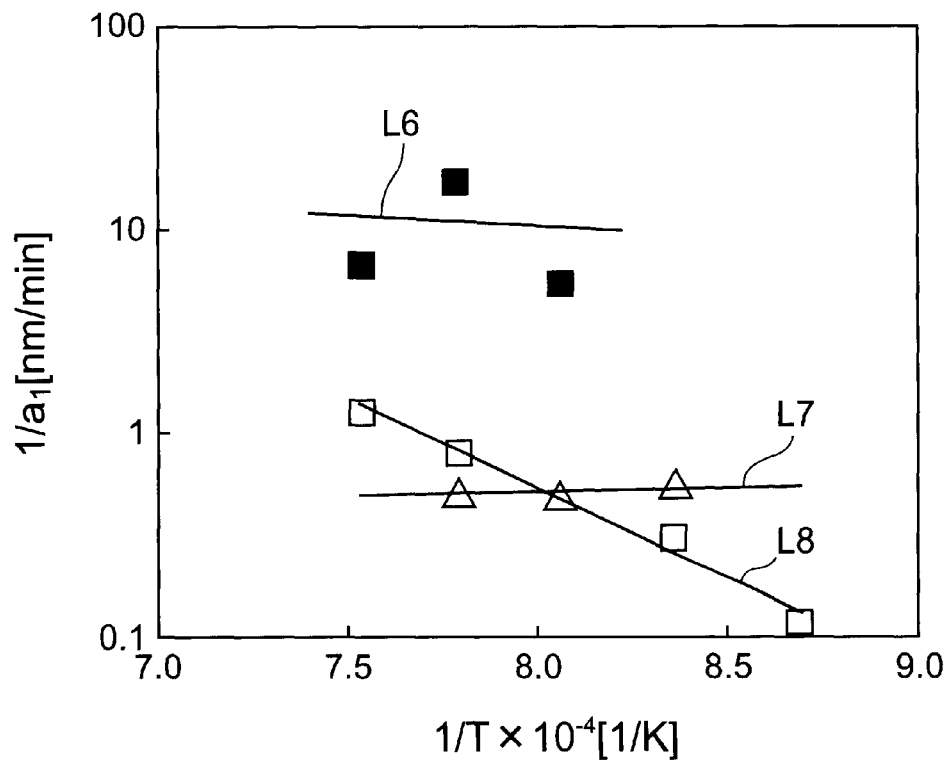
FIG. 11 is a graph to show changes of $1/a_1$ against inverse of film-forming temperature T(K) in Examples 1 and 2 and in Comparative Example 1.

Then, for the film-forming conditions with the n-value in the range of 1 to 2, the $1/a_2$, $1/a_1$ values from the quadratic approximate expression (Eq. (2)) obtained from FIGS. 5 to 7 were plotted against inverse of film-forming temperature and the activation energy was determined in the oxide generating reaction under each condition. FIG. 10 is a graph to show changes of $1/a_2$ against inverse of film-forming temperature T(K) in Examples 1 and 2 and in Comparative Example 1. FIG. 11 is a graph to show changes of $1/a_1$ against inverse of film-forming temperature T(K) in Examples 1 and 2 and in Comparative Example 1. In the figures, straight lines L3 and L6 represent the results of Example 1, straight lines L4 and L7 the results of Example 2, and straight lines L5 and L8 the results of Comparative Example 2.

Table 3 presents the activation energies of reaction obtained from the slope of each straight line of FIGS. 10 and 11. Table 3 also provides the document values of Deal-Grove together with the results of the examples.

TABLE 3

|  | Activation energy as to $1/a_2$ | | Activation energy as to $1/a_1$ | |
|---|---|---|---|---|
|  | (× 10⁻¹⁰ nJ) | (eV) | (× 10⁻¹⁰ nJ) | (eV) |
| Comparative Example 2 | 3.84 | 2.40 | 2.76 | 1.72 |
| Example 1 | 2.13 | 1.33 | −0.08 | −0.05 |
| Example 2 | 2.39 | 1.49 | 0.54 | 0.34 |
| DG (dry) | 1.99 | 1.24 | 3.20 | 2.00 |
| DG (wet) | 1.14 | 0.71 | 3.14 | 1.96 |

The activation energy of the straight region, i.e., the activation energy with respect to $1/a_1$ is considered to be equal to the dissociation energy of Si—Si linkage (bond) of Si wafer, and those of DG (dry) and DG (wet) are almost equal, about $3.2 \times 10^{-10}$ nJ (about 2 eV). In contrast, the activation energy with respect to $1/a_1$ in Comparative Example 2 was $2.76 \times 10^{-10}$ nJ (1.72 eV) as shown in Table 3, and was close to the values of DG (dry) and DG (wet). On the other hand, the activation energies with respect to $1/a_1$ in Examples 1 and 2 were $-0.08 \times 10^{-10}$ nJ ($-0.05$ eV) and $0.54 \times 10^{-10}$ nJ (0.34 eV), respectively, and were considerably smaller than the values of DG and Comparative Example 2.

This decrease of the activation energy with respect to $1/a_1$ in the examples can be considered as follows, for example. The reaction heat in the reaction to generate water from the hydrogen gas and oxygen gas (the reaction represented by Formula (7) below;

$$H_2 + \tfrac{1}{2} O_2 = H_2 O \tag{7}$$

is $19.9 \times 10^{-10}$ nJ (12.4 eV) per mole of $H_2$, and this is a value far greater than the aforementioned dissociation energy of Si—Si linkage.

According to the present invention, the reaction between hydrogen gas and oxygen gas supplied into the chamber occurs on the Si wafer selectively heated and the Si wafer surface is exposed as a bulk (whole) to the various chemically active species generated during the combustion reaction of the two gases. It is presumed that these chemically active species reach the interface of the Si wafer and give energy to the dissociation reaction of Si—Si linkage on the occasion of reaction with Si, thereby lowering the apparent activation energy of the dissociation reaction. However, the action is not limited to this.

From Table 3, the activation energies with respect to $1/a_2$ in Examples 1 and 2 are smaller than the value of Comparative Example 2. The activation energy with respect to $1/a_2$ is the activation energy of the parabolic region and is the value dominated by the diffusion process of the oxidizing factors in the oxide film. Since the reactant gases are different between in the examples and in the comparative example, their acting mechanisms of the diffusion reaction are considered to be naturally different from each other.

Since the values of the activation energy with respect to $1/a_1$ (see Table 3), obtained from FIG. 11, are different from each other between in the examples and in the comparative example, it is hard to believe that the diffusing factor in the film-forming method (in the examples) of the present invention is water having a linear rate constant equivalent to that of oxygen being the oxidizing factor in the conventional dry oxidation (in the comparative example). It was also reported that there was a tendency of decrease in the activation energy of the reaction rate constant of the parabolic region in the film formation of oxide film with radical oxygen (Document: Ayuka Morioka et al., JSAP Catalogue, Proceedings (1998), "Formation, characterization, and reliability of very thin silicon oxide film," special workshop sponsored by Division of Thin Film and Surface Physics in Japanese Society of Applied Physics), and it is considered that the values of the activation energy with respect to $1/a_1$ and $1/a_2$ in the examples suggest existence of active species having high reactivity, such as radical oxygen.

Example 3

The oxide film was formed on the surface of Si wafer in the same manner as in Examples 1 and 2 except for variations in the partial pressures of the hydrogen gas and oxygen gas (or the mixture ratio of the reactant gases) and in the total pressure of the reactant gases. The $1/a_2$ values were determined in the same manner as described above from the data of the thickness of oxide film against film-forming time.

<Consideration on Pressures of Reactant Gases>

Figure 12:
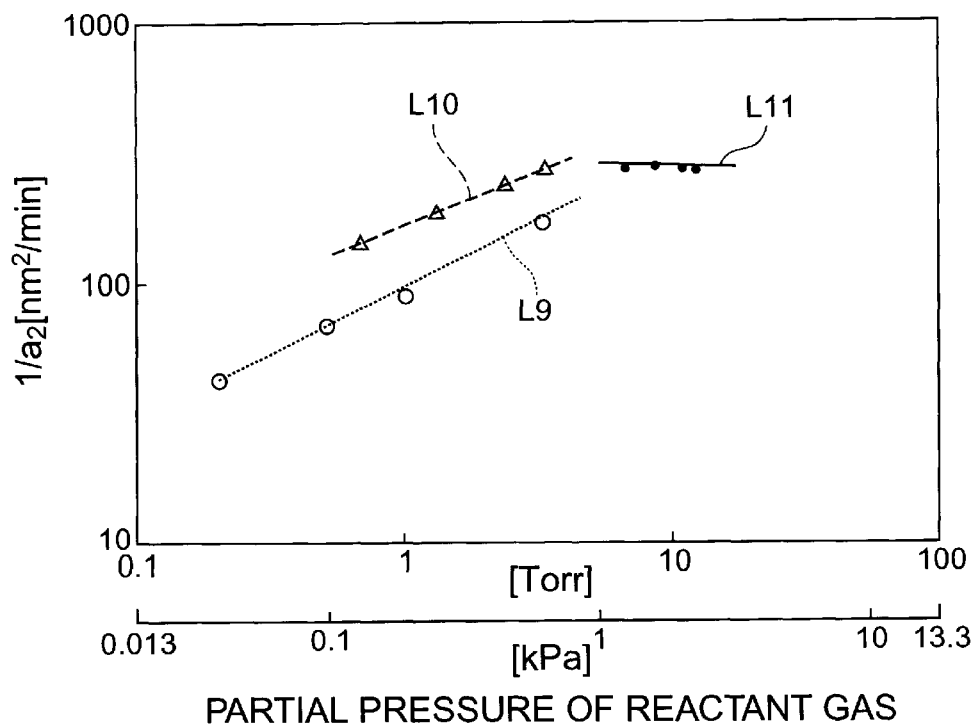
FIG. 12 is a graph to show changes of $1/a_2$ value against partial pressure of reactant gases in Example 3.

FIG. 12 is a graph to show changes of $1/a_2$ against partial pressures of the reactant gases in Example 3, and indicates dependence of $1/a_2$ value on the concentration of each reactant gas. In the figure, straight lines L9 and L10 represent the results against the partial pressure of hydrogen gas, which were obtained at the film-forming temperatures of 1050° C. and 1100° C., respectively. A straight line L11 represents the results against the partial pressure of oxygen gas, which were obtained at the film-forming temperature of 1100° C. It was found from the figure that the $1/a_2$ value was little dependent upon the partial pressure of oxygen gas (the slope of the straight line L11 was 0.06) but was approximately proportional to the square root of the partial pressure of hydrogen gas (the slopes of the straight lines L9 and L10 were 0.499 and 0.409, respectively). It is contemplated from this result that generation of the chemical species in the decomposition process of hydrogen gas and/or oxidizing factors associated with the chemical species generated in the elementary reactions in which the chemical species are involved, relates to the determination of oxidation reaction rate, particularly, in the parabolic region.

Figure 13:
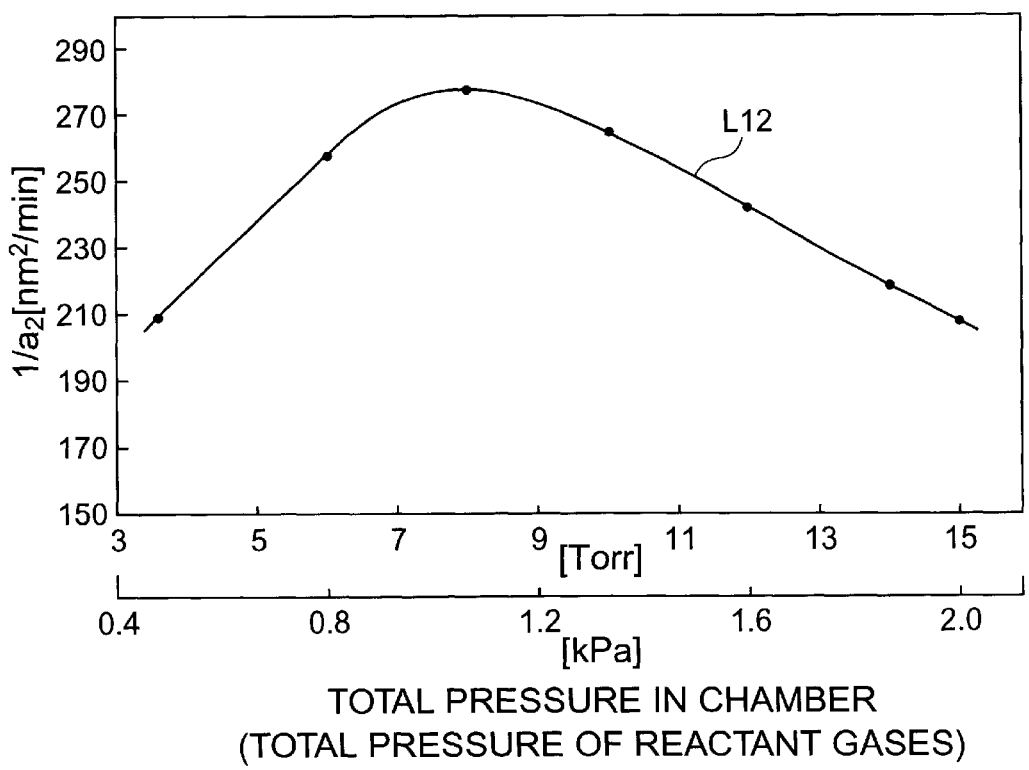
FIG. 13 is a graph to show a change of $1/a_2$ value against total pressure in the chamber (total pressure of reactant gases) in Example 3.

FIG. 13 is a graph to show changes of $1/a_2$ against total pressure in the chamber (total pressure of reactant gases) in Example 3, in which a curve L12 indicates dependence of $1/a_2$ on total concentration of reactant gases. From the figure, the $1/a_2$ value takes a maximum at the total pressure of about 1 kPa (about 8 Torr) in the chamber. When the total pressure in the chamber is too low or high, decrease of the $1/a_2$ value tends to become prominent. Namely, this can possibly results in failing to achieve a sufficiently high film-forming rate.

This result verifies that the film-forming method of the invention exhibits its advantage when the total pressure in the chamber is in the range of 0.5 to 2 kPa (about 4 to 15 Torr). As described previously, this is conceivably because it is difficult to realize a sufficient reactant gas concentration in the pressure range of less than 0.5 kPa and the chemical species generated in the vapor phase are deactivated by interaction or combination in the pressure range over 2 kPa.

Example 4

The oxidation process of the silicon nitride film was carried out in the same manner as in Example 1, except that the substrate to be treated was an Si wafer on which an oxide film of 100 nm was formed by dry oxidation, thereafter a film of silicon nitride ($Si_3N_4$) was deposited by the thermal CVD method, and a predetermined pattern (for shallow trenches) was further formed. The portions subjected to the film-forming treatment were observed with a transmission electron microscope (TEM) and it was confirmed from the observation that the silicon nitride film was oxidized.

Comparative Example 5

An attempt to form an oxide film was conducted in the same manner as in Comparative Example 1, except that the same Si wafer as that in Example 4 was used as a substrate to be treated and the film-forming system was Furnace (dry oxidation by Furnace system). The portions subjected to the film-forming treatment were observed with TEM and it was confirmed from the observation that the silicon nitride film was not oxidized.

Comparative Example 6

The film-forming treatment was conducted in the same manner as in Comparative Example 5, except that water (steam) preliminarily generated was used as a reactant gas (wet oxidation by Furnace system). The portions subjected to the film-forming treatment were observed with TEM and it was confirmed from the observation that the silicon nitride film was not oxidized.

<Consideration on Reaction Mechanism>

From the results obtained for the above examples and comparative examples, it was verified that:

1) the activation energy with respect to $1/a_1$, which is the rate constant in the rate-determining region in the film-forming reaction, is small;

2) the activation energy with respect to $1/a_2$ has a peak value against change of the total pressure of reactant gases;

3) the silicon nitride film is oxidized in the examples according to the film-forming method of the present invention.

From these, the mechanism of formation of oxide film in the examples using the film-forming method according to the present invention is one in which the chemically active, chemical species (chemically active species) resulting from the combustion of oxygen and hydrogen immediately above the Si wafer are involved as oxidizing factors in the reaction, and it is thus considered to be the oxidation reaction mainly with the active oxidizing species in a sense. It is then speculated that the oxidation reaction with such active oxidizing species remarkably increases the film-forming rate and forms the oxide film with such quality as excellent thickness uniformity and repeatability.

Example 5

The oxidation treatment of silicon nitride film was conducted in the same manner as in Example 2, except that the substrate was an Si wafer on which an oxide film of 100 nm was formed by dry oxidation, thereafter a film of silicon nitride was deposited by the thermal CVD method, and a predetermined pattern (for shallow trenches) was further formed. The film-forming portions of the Si wafer treated under the conditions of the film-forming temperature of 1050° C. and the film-forming time of 150 sec were observed with TEM and it was confirmed from the observation that the silicon oxide film was formed on the silicon nitride film.

<Evaluation of Oxide Film-Forming Rate of Silicon Nitride Film>

Thicknesses of silicon oxide films on the Si wafers different in film-forming time, treated in Example 5, were measured with TEM and the film-forming rate was calculated from these thicknesses and film-forming times. As a result, the film-forming rate of silicon oxide film in Example 5, i.e., the oxidation rate of silicon nitride film was 0.093 nm/sec (film-forming temperature 1050° C., film-forming time 150 sec).

In contrast with it, according to a document (O. D. Trapp, et al., "Semiconductor Technology Handbook," Fig. OXIDATION OF $Si_3N_4$ IN STEAM, Page 3–10, Technology Associates), the oxidation rates of silicon nitride film by the conventional wet oxidation method are 0.0092 nm/sec (film-forming temperature 1000° C., film-forming time $3 \times 10^5$ sec) and 0.0306 nm/sec (film-forming temperature 1100° C., film-forming time $3 \times 10^5$ sec).

From comparison between them, though there is a difference in the film-forming time for the evaluation of film-forming rate, the measurement of the film-forming rate in Example 5 is approximately an order of magnitude greater than the document value (at the film-forming temperature 1000° C.) by the wet oxidation method, and is also a little greater than approximately three times the document value at the higher film-forming temperature (film-forming temperature 1100° C.) than in Example 5. It was confirmed from this result that the film-forming method of the present invention remarkably increases the film-forming rate in the oxidation treatment of nitride film, as compared with the conventional methods.

As described above, the film-forming method and system of the present invention are able to achieve adequate thickness repeatability and uniformity and sufficiently large film-forming rates in the film formation of thin film on the substrate, and make simplification of system configuration feasible.

What is claimed is:

1. A method of forming a thin film in a semiconductor device, comprising:
   placing a substrate in a chamber, said substrate having a first electrode with a nitride film formed above said electrode;
   heating said substrate;
   reducing the pressure around said substrate; and
   providing a reactant gas containing a first gas and a second gas into said chamber, said second gas being capable of releasing energy by reacting with said first gas, so as to mix said first gas and said second gas, on said substrate and forming a first oxide film on said nitride film by oxidizing at least a portion of said nitride film.

2. The method of claim 1, wherein said first gas is a gas having hydrogen atoms in a molecule and said second gas is oxygen gas.

3. The method of claim 2, wherein in said first gas is hydrogen gas.

4. The method of claim 1, further comprising a step of changing a mixture ratio of said first gas and said second gas while forming said first oxide film.

5. The method of claim 1, wherein said pressure reducing step reduces the pressure within said chamber to between 0.5 to 2 kPa.

6. The method of claim 1, wherein said substrate further comprises a second oxide film formed between said electrode and said nitride film.

7. The method of claim 1 further comprising the step of forming a second electrode on said first oxide film formed by providing said reactant into said chamber.

8. The method of claim 7, wherein said first electrode is a floating gate electrode and said second electrode is a control gate electrode of a nonvolatile memory device.

9. The method of claim 8, wherein said nonvolatile memory device is an EEPROM.

* * * * *